US006996152B2

(12) United States Patent
Vurgaftman et al.

(10) Patent No.: US 6,996,152 B2
(45) Date of Patent: Feb. 7, 2006

(54) PHOTONIC-CRYSTAL DISTRIBUTED-FEEDBACK AND DISTRIBUTED BRAGG-REFLECTOR LASERS

(75) Inventors: Igor Vurgaftman, Pikesville, MD (US); Jerry Meyer, Catonsville, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 231 days.

(21) Appl. No.: 10/385,165

(22) Filed: Mar. 7, 2003

(65) Prior Publication Data

US 2003/0169787 A1 Sep. 11, 2003

Related U.S. Application Data

(60) Provisional application No. 60/362,984, filed on Mar. 7, 2002.

(51) Int. Cl.
H01S 3/08 (2006.01)

(52) U.S. Cl. .............................. 372/96; 372/20; 372/32; 372/50.1; 372/50.124; 372/92; 372/102

(58) Field of Classification Search .................. 372/20, 372/32, 50.1, 50.11, 92, 96, 50.124
See application file for complete search history.

(56) References Cited

U.S. PATENT DOCUMENTS 3,970,959 A   7/1976 Wang et al.

(Continued)

FOREIGN PATENT DOCUMENTS

WO   WO03076976   * 9/2003

OTHER PUBLICATIONS

J.D. Joannopoulous, et al. "Photonic Crystal:putting a new twist on light" Nature! vol. 386 13, Mar. 1997, Pags. 143-149.*

(Continued)

Primary Examiner—Minsun Oh Harvey
Assistant Examiner—Delma R. Flores-Ruiz
(74) Attorney, Agent, or Firm—John J. Karasek; L. George Legg

(57) ABSTRACT

A photonic-crystal distributed-feedback laser includes a laser cavity with a waveguide structure that has a cavity length $L_c$ and is bounded by two mirrors; an active region for producing optical gain upon receiving optical pumping or an input voltage; at least one layer having a periodic two-dimensional grating with modulation of a modal refractive index, the grating being defined on a rectangular lattice with a first period along a first axis of the grating and a second period along a second perpendicular axis of the grating, and wherein the grating produces three diffraction processes having coupling coefficients $\kappa_1'$, $\kappa_2'$, $\kappa_3'$; and a lateral gain area contained within a second area patterned with the grating that has substantially a shape of a gain stripe with a width W, with the gain stripe tilted at a first tilt angle relative to the two mirrors. The rectangular lattice of the grating is tilted at a second tilt angle substantially the same as the first tilt angle with respect to the gain stripe, and the ratio of the first and second grating periods is equal to the tangent of the first tilt angle, with the first tilt angle being between about 16° and about 23°. The hexagonal lattice does not need to be tilted with respect to the two mirrors. The laser's output emerges along the normal to a facet irrespective of the operating laser wavelength, facilitating coupling the laser light into a fiber or other optical system while avoiding beam steering. The two-dimensional nature of the feedback in the laser provides for varying the wavelength through angle tuning. Wavelength tuning by changing the propagation direction (propagation angle) permits a straightforward selection of different wavelengths from photonic crystal devices monolithically fabricated on a single wafer. The fabrication procedure is straightforward since no ridges need to be defined. The single-mode spectral purity of the rect-angular-lattice PCDFB is robust, owing to the near absence of side modes, and exhibits good beam quality.

11 Claims, 12 Drawing Sheets

U.S. PATENT DOCUMENTS

| | | | |
|---|---|---|---|
| 5,337,328 A | | 8/1994 | Lang et al. |
| 6,052,213 A | | 4/2000 | Burt et al. |
| 6,122,299 A | | 9/2000 | DeMars et al. |
| 6,683,898 B2 | * | 1/2004 | .Oslashed.stergaard et al. .................. 372/43.01 |
| 6,826,223 B1 | * | 11/2004 | Meyer et al. .................. 372/96 |
| 6,868,107 B2 | * | 3/2005 | Vurgaftman et al. .......... 372/96 |

OTHER PUBLICATIONS

O. Painter etal., "Lithographic tuning of a Two-Dimensional Photonic Crystal Laser Array", IEEE Photonic LTechnology Letters, vol. 12, No. 9, Sep. 2000, pp. 1126-1128.*

Song Peng et al., "Esperimental demostrationof resonant anomalies in diffraction from two dimensional gratings" Optical Society of America, vol. 21, No. 8, Apr. 15, 1996, pp. 549-551.*

Jayaraman et al., "Theory, Design, and Performance of Extended Tuning Range Semiconductor Lasers with Sampled Gratings", IEEE Journal of Quantum Electronics, Jun. 1993, vol. 29, No. 6.

Weber, "Optimization of the Carrier-Induced Effective Index Change in InGaAsP Waveguides-Application to Tunable Bragg Filters", IEEE Journal of Quantum Electronics, Aug. 1994, vol. 30, No. 8.

Cho et al., "1.9-W Quasi-CW from a Near-Diffraction n-Limited 1.55-um InGaAsP-InP Tapered Laser", IEEE Photonics Technology Letters, Aug. 1998, vol. 10, No. 8.

Painter et al., "Two-Dimensional Photonic Band-Gap Defect Mode Laser", Science, Jun. 11, 1999, vol. 284.

Sarangan et al., "Specrtal Properties of Angled-Grating High-Power Semiconductor Lasers", IEEE Journal of Quantum Electronics, Aug. 1999, vol. 35, No. 8.

Vurgaftman et al., "Far-field Characteristics of Mid-Infrared Angled-Grating Distributed Feedback Lasers", Journal of Applied Physics, Dec. 15, 2000, vol. 88, No. 12.

Lang et al., "Theory of Grating-Confined Broad-Area Lasers", IEEE Journal of Quantum Electronics, Nov. 1998, vol. 34, No. 11.

Kalluri et al., "Large Spatial Mode, Single Frequency Semiconductor Lasers Using Two Dimensional Gratings", Optical Society of America, 1999.

Kallinger et al., "A Nearly Diffraction Limited Surface Emitting Conjugated Polymer Laser Utilizing a Two-Dimensional Photonic Band Structure", Applied Physics Letters, vol. 77, No. 15.

Imada et al., "Coherent Two-Dimensional Lasing Action in Surface-Emitting Laser With Triangular-Lattice Photonic Crystal Structure", Applied Physics Letters, Jul. 19, 1999, vol. 75, No. 3.

Han et al., Two-Dimensional Rectangular Lattice Distributed Feedback Lasers: A Couple-Mode Analysis of TE Guided Modes, IEEE Journal of Quantum Electronics, Nov. 1995, vol. 31, No. 11.

Toda, "Proposed Cross Grating Single-Mode DFB Laser", IEEE Journal of Quantum Electronics, Jul. 1992, vol. 28, No. 7.

Vurgaftman et al., "Method For Designing Photonic-Crystal Distributed-Feedback and Distributed Bragg-Reflector Lasers", U.S. Appl. No. 10/390,255 Filed Mar. 7, 2003.

* cited by examiner

PHOTONIC-CRYSTAL DISTRIBUTED-FEEDBACK AND DISTRIBUTED BRAGG-REFLECTOR LASERS

The present invention claims priority from U.S. Provisional Application No. 60/362,984, filed Mar. 7, 2002, entitled "Photonic-Crystal Distributed-Feedback and Distributed Bragg-Reflector Laser", incorporated herein by reference.

TECHNICAL FIELD

The present invention relates to photonic crystal based lasers. More particularly, the invention relates to photonic crystal distributed feedback lasers.

BACKGROUND ART

An ideal semiconductor laser that would emit high power into a single spectral mode with diffraction-limited output profile is of great interest in a number of applications, including spectroscopy or wavelength multiplexing in telecommunications. However, known laser configurations have been unable to provide the desired diffraction-limited output profile without sacrificing power output, and vice versa. For example, in one approach, a distributed-feedback (DFB) configuration using a one-dimensional (1D) diffraction grating parallel to the laser facets provides high spectral purity when the waveguide is sufficiently narrow, e.g. on the order of 2–5 $\mu$m for lasers emitting at 0.8–1.55 $\mu$m wavelengths, thereby suppressing higher-order lateral modes with respect to the fundamental mode. Scaling up the stripe width provides increased power but has the drawback of producing a loss of phase coherence across the DFB laser stripe, primarily due to the self-modulation of the refractive index in the active region by non-uniformly distributed carriers. The laser output spectrum is undesirably broadened and limited by the width of the gain spectrum, producing a rapidly diverging, often double-lobed, far-field pattern.

The use of two-dimensional (2D) gratings has been studied employing coupled-mode theory, e.g. "Proposed cross grating single-mode DFB laser", M. Toda, IEEE J. Quantum Electron. (1992) and "Two-dimensional rectangular lattice distributed feedback lasers: a coupled-mode analysis of TE guided modes", H. Han and J. J. Coleman, IEEE J. Quantum Electron. (1995). However, these approaches were directed to superimposing 1D gratings in lieu of using actual 2D gratings which allows only two diffraction processes. Also, realistic device geometries and the critical role played by the linewidth enhancement factor (LEF) were not considered.

Another approach, described in U.S. Pat. No. 3,970,959 to Wang et al., is directed to utilizing a DFB laser with a 2D grating to produce periodic perturbations of an acoustic wave by the photo-elastic effect. The approach, however, merely involved varying the refractive index without disclosing device parameters or a 2D lattice structure. Other publications, such as "Coherent two-dimensional lasing action in surface-emitting laser with triangular-lattice photonic crystal structure", M. Imada et al., Appl. Phys. Lett. (1999), while disclosing experimental demonstrations of the 2D distributed feedback (DFB) lasers, are limited to surface-emitting schemes.

Yet another approach disclosed in OSA Topical Meeting on Advanced Semiconductor Lasers and Applications, Paper AWA6, Kalluri et al. (1999) is directed to an edge-emitting device with a 2D photonic crystal grating. However, the selected geometry, with the facets being tilted relative to the grating to achieve emission normal to the facet, produces an output consisting of two beams emerging at large angles to normal, not a single near-diffraction-limited beam normal to the facet.

The α-DFB laser, disclosed in "Theory of grating-confined broad-area lasers", J. Lang, K. Dzurko, A. A. Hardy, S. DeMars, A. Schoenfelder, and D. F. Welch, IEEE J. Quantum Electron. (1998), is directed to a configuration in which both the diffraction grating and the gain stripe are tilted with respect to the laser facets. However, both the cavity facets and the grating are necessary to produce optical feedback and laser oscillation is established when the beam approaches the facet nearly at normal incidence, since only then is the optical wave strongly reflected back into the cavity along the same path for feedback. It is primarily this reflection of only a narrow angular cone at the facets that leads to diffraction-limited output beams for much wider pump stripes than normally attainable in the Fabry-Perot geometry. A problem with this is that none are robust enough to maintain a single mode under all conditions of interest.

In the approach disclosed in "Single-mode spectral output observed under cw pumping in shorter-wavelength α-DFB lasers", A. M. Sarangan et al, IEEE J. Quantum Electron. (1995) and "Far-field characteristics of mid-infrared angled-grating distributed-feedback lasers", I. Vurgaftman et al., J. Appl. Phys., (2000), the near-IR laser line broadened in pulsed mode while mid-IR devices exhibited little spectral narrowing. This indicates that the spectral selectivity of α-DFB lasers is in general considerably lower than in other DFB lasers. A small deviation in the angle of orientation translates into a large (on the scale of the gain bandwidth) shift in the emission wavelength. Angled-grating (α-DFB) device configurations have been disclosed, for example, in U.S. Pat. No. 5,337,328 to Lang et al. and in U.S. Pat. No. 6,122,299 to DeMars et al.

U.S. Pat. No. 6,052,213 to Burt et al. was concerned with fabricating a diffraction grating in a semiconductor wafer, which can in principle replace a bulk optical grating component. A problem with this patent is that the 2D pattern is limited to no more than 10 rows, preferably 1–3 rows and the grating is used simply to disperse the incoming light at grazing incidence to the sample surface.

"Two-dimensional photonic band-gap defect mode laser", O. Painter, R. K. Lee, A. Scherer, A. Yariv, J. D. O'Brien, P. D. Dapkus, and I. Kim, Science, vol. 284, pp. 1819–1821 (1999), discloses photonic bandgap lasers and optical components employing 2D photonic crystals as a means of suppressing spontaneous emission into unwanted optical modes or creating a microcavity or waveguide. The disclosed device seeks to achieve a large photonic bandgap, usually at as wide a range of angles as possible. High output power can be combined with good beam quality in the tapered-laser design of "1.9-W quasi-CW from a near-diffraction-limited 1.55-$\mu$m InGaAsP—InP tapered laser", S. H. Cho, S. Fox, F. G. Johnson, V. Vusiricala, D. Stone, and M. Dagenais, IEEE Photon. Technol. Lett. (1998). The tapered laser consists of two distinct sections of the optical waveguide. The first section is a single-mode ridge waveguide, and the second is a funnel-shaped gain-guided region. A combination of high-reflectivity (HR) and antireflection (AR) coatings insures that nearly all of the laser light emerges from the tapered section end. However, the output power of tapered lasers is constrained by the maximum aperture that can produce diffraction-limited output for a given injected current density and the design becomes less attractive for materials with substantial carrier-induced refractive-index fluctuations.

Single-mode operation can also be obtained with a narrow-stripe distributed Bragg reflector (DBR) laser, in which the distributed feedback is confined to mirror-like gratings at one or both ends of the optical cavity. While the grating does not extend into the central region, the feedback from the DBR mirrors is wavelength-selective unlike that in Fabry-Perot lasers. DBR lasers face the same problems as DFB emitters with regard to deterioration of the beam quality and side mode suppression as the stripe is broadened. Widely tunable lasers are known, e.g. as disclosed in "Optimization of the carrier-induced effective-index change in InGaAsP Waveguides—Application to tunable Bragg filters", J. P. Weber, IEEE J. Quantum Electron. (1994). However, the spectral range is limited by the magnitude of the interband and intervalence absorption contributions to the refractive index, since the plasma shift is relatively small at the telecommunications wavelength of 1.55 $\mu$m. Sampled-grating DBR lasers, in which the tuning range has reached 72 nm are also known, as disclosed in "Theory, design, and performance of extended tuning range semiconductor lasers with sampled gratings", V. Jayaraman et al., IEEE J. Quantum Electron (1993). A drawback with this type of laser is that very narrow ridge waveguides are required in order to assure lateral coherence of the laser beam.

None of these approaches provide guidance for identifying the optimized parameters (aspect ratio, etch depth, grating feature size etc.) for structures with 2D gratings. They also do not consider including all three relevant diffraction processes for the rectangular lattice, or, apart from Kalluri et al., tilting the grating.

DISCLOSURE OF THE INVENTION

According to the invention, a wavelength-tunable multi-section laser for producing an output normal to one of two opposing facets includes a laser cavity bounded by i) a first edge and a second opposing edge, and ii) a first such facet and a second, opposing facet. The laser cavity includes: a waveguide structure; a central section, for producing gain upon receiving a first input voltage, that is defined by a first boundary and a second opposing boundary, and that includes an active region and has a first modal refractive index; a first grating with period $\Lambda_1$, extending between the first and second facets, which is positioned perpendicular to the first and second boundaries and is inclined at an angle $\theta_2$ relative to the facets; and a first tuning section, located between the first boundary and the first facet, having a first tuning electrode and a second modal refractive index. The laser further includes a second input voltage for varying the second modal refractive index to tune the wavelength of the output.

Also according to the invention, a photonic-crystal distributed-feedback laser includes: a laser cavity with a waveguide structure that has a cavity length $L_c$ and is bounded by two mirrors; an active region for producing optical gain upon receiving optical pumping or an input voltage; at least one layer having a periodic two-dimensional grating with modulation of a modal refractive index, the grating being defined on a rectangular lattice with a first period along a first axis of the grating and a second period along a second perpendicular axis of the grating, and wherein the grating produces three diffraction processes having coupling coefficients $\kappa_1'$, $\kappa_2'$, $\kappa_3'$; and a lateral gain area contained within a second area patterned with the grating that has substantially a shape of a gain stripe with a width W, with the gain stripe tilted at a first tilt angle relative to the two mirrors. The rectangular lattice of the grating is tilted at a second tilt angle substantially the same as the first tilt angle with respect to the two mirrors, and the ratio of the first and second grating periods is equal to the tangent of the first tilt angle, with the first tilt angle being between about 16° and about 23°.

Also according to the invention, a photonic-crystal distributed-feedback laser includes: a laser cavity with a waveguide structure that has a cavity length $L_c$ and is bounded by two mirrors; an active region for producing optical gain upon receiving optical pumping or an input voltage; at least one layer having a periodic two-dimensional grating with modulation of a modal refractive index, the grating being defined on a hexagonal lattice with a first period along a first axis of the grating and a second period along a second perpendicular axis of the grating, and wherein the grating produces three diffraction processes having coupling coefficients $\kappa_1'$, $\kappa_2'$, $\kappa_3'$; and a lateral gain area contained within a second area patterned with the grating that has substantially a shape of a gain stripe with a width W, with the gain stripe tilted at a first tilt angle relative to the two mirrors. The rectangular lattice of the grating is tilted at a second tilt angle substantially the same as the first tilt angle with respect to the two mirrors, and the ratio of the first and second grating periods is equal to the tangent of the first tilt angle, with the first tilt angle being between about 16° and about 23°.

Also according to the invention, a photonic-crystal distributed-feedback laser includes a laser cavity in the shape of a microdisk with a diameter D of at least about 100 $\mu$m; an active region for producing optical gain upon receiving optical pumping or an input voltage; at least one layer having a periodic square-lattice grating with modulation of a modal refractive index, wherein the grating produces three diffraction processes having coupling coefficients $\kappa_1$ and $\kappa_2$ satisfying the constraints: $0.5 \leq |\kappa_1|D \leq 2.0$; and $0.5 \leq |\kappa_2|D \leq 2.0$; and a lateral gain area bounded by the microdisk cavity.

Also according to the invention, a photonic-crystal distributed-feedback laser includes: a laser cavity bounded by at least one mirror; an active region for producing optical gain upon receiving optical pumping or an input voltage; at least one layer including a periodic two-dimensional grating with modulation of a modal refractive index; a lateral gain area; and a resonant lasing wavelength that can be tuned by varying an angle of propagation with respect to a Brillouin zone boundary of an oblique lattice so that said wavelength tuning is inversely proportional to the cosine of any differential change in said angle of propagation.

Also according to the invention, a photonic-crystal distributed-feedback laser includes: a laser cavity bounded by two mirrors; an active region for producing optical gain upon receiving optical pumping or an input voltage; at least one layer including a periodic line grating with modulation of a modal refractive index; a lateral gain area; and at least one layer wherein a second line grating is formed by injecting carriers in a periodic pattern using an optical pump spatially modulated along a direction perpendicular to said line grating.

The invention has several advantages over conventional devices. The laser output emerges along the normal to a facet irrespective of the operating laser wavelength, thereby facilitating coupling the laser light into a fiber or other optical system while avoiding beam steering. The PCDFB scheme is robust, provides good side-mode suppression ratio, and does not necessitate that the $\Gamma g_{th}\alpha$ product be low.

Furthermore, the two-dimensional nature of the feedback in these lasers provides for varying the wavelength through angle tuning, since in a photonic crystal the resonance wavelength is not fixed by the period as in 1D DFB and DBR lasers but varies as a function of the propagation direction. Wavelength tuning by changing the propagation direction (propagation angle) permits a straightforward selection of different wavelengths from photonic crystal devices monolithically fabricated on a single wafer. The fabrication procedure is straightforward since no ridges need to be defined.

The PCDFB laser of the invention yields a nearly diffraction-limited output. The single-mode spectral purity of the rectangular-lattice PCDFB is robust, owing to strong side-mode suppression, and exhibits good beam quality.

The present invention also provides a substantial extension of the conditions under which single-mode operation can be sustained in the presence of LEF-driven index fluctuations. The PCDFB has an extensive single-mode region, and single-mode output powers may be up to an order of magnitude higher in comparison with conventional lasers. The hexagonal-lattice PCDFB can produce a single-mode output at stripe widths of up to approximately 1.5 mm, and yield single-mode powers higher than $\alpha$-DFB devices by a factor of approximately 2.5. The PCDBR allows optical coherence to be maintained over a much wider gain stripe, and therefore enables higher powers to be emitted into a single mode.

Many laser configurations are possible, for example, separable-grating schemes and schemes based on superstructure gratings or chirped gratings. In these cases, the maximum output power of the wavelength-tunable single mode is substantially enhanced when inventive PCDBR mirrors are employed because coherence can be maintained for a much wider stripe. Electrically-pumped PCDFB devices will operate up to the maximum modulation frequencies characteristic of state-of-the-art conventional DFB devices, i.e., in the GHz range.

Additional features and advantages of the present invention will be set forth in, or be apparent from, the detailed description of preferred embodiments which follows.

BEST MODE FOR CARRYING OUT THE INVENTION

Figure 1:
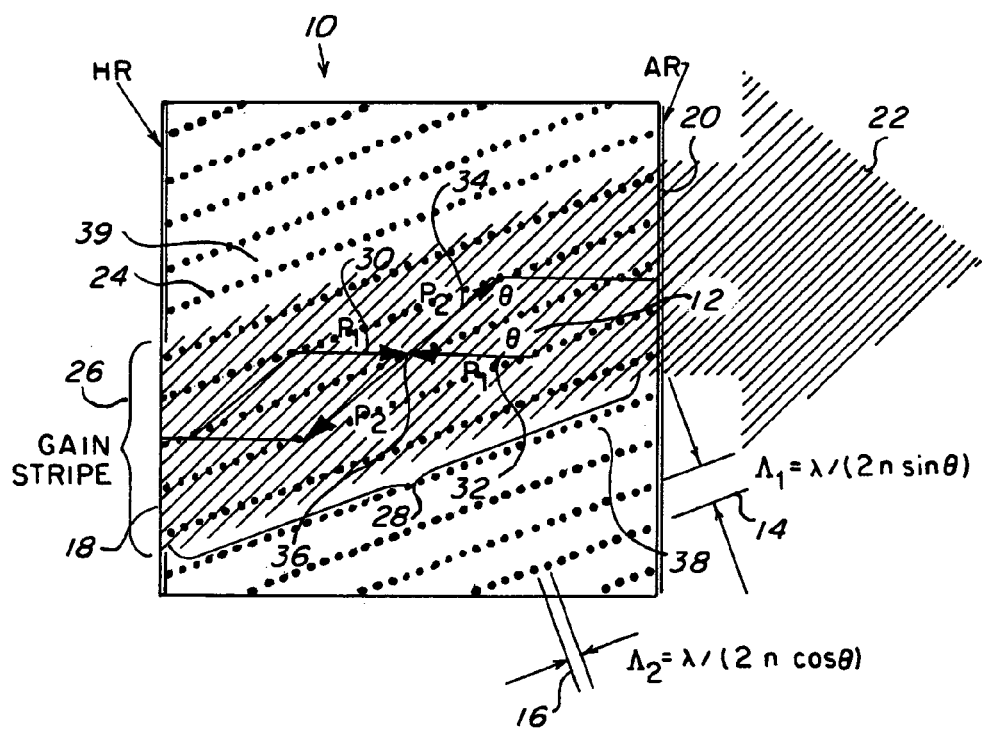
FIG. 1 shows a schematic representation of the rectangular-lattice PCDFB laser with circular grating features and a tilted gain stripe according to the present invention.

With reference to the drawings, FIG. 1 shows a two-dimensional photonic crystal (PCDFB) laser geometry (10) comprising a lattice symmetry that is rectangular, along with an angle $\theta$ (12) that specifies an aspect ratio of the two lattice periods, $\Lambda_1$ (14) and $\Lambda_2$ (16). The periods, $\Lambda_1$ (14) and $\Lambda_2$ (16) are representative of the spacing between the grating features (24) along the x-axis ($\Lambda_1$) and the z-axis ($\Lambda_2$). Although the invention is described referencing a rectangular geometry and TE- and TM-polarized light equations specialized to the case of a rectangular lattice, it should be understood that other lattice symmetries such as hexagonal and triangular lattices utilizing couplings between the six equivalent $\Gamma$-X directions in the reciprocal space are also included. The type of geometry selected depends on the properties of the gain medium and the output desired from the laser.

In the PCDFB configuration of FIG. 1, there are two propagation directions, $P_1$ (30) and $P_2$ (34). The two cleaved edges (18 and 20), or facets are aligned with one (30) of the two coupled propagation directions ($P_1$ in FIG. 1) so that the laser output beam (22) emerges in a direction nearly normal to the facet to facilitate collection and collimation. However, other alignments are possible depending on the desired laser beam alignment, while the facets may be uncoated or coated (either AR-coated, HR-coated, or one of each). For the purpose of describing the design method of the present invention, uncoated facets are described herein.

The rectangular lattice shown in FIG. 1 has circular shallow grating features (24) of radius r that produce modulation of the refractive index. Modulation can also be attained using grating features with a shape other than circular (such as square, rectangle, ellipse, or some more arbitrary shape). Also, although the grating features (24) shown in FIG. 1 are assumed to be etched holes, other well-known means to periodically modulate the refractive index (such as etched pillars, the deposition of a material with different optical constants, etc.) may be used equally well to provide these features.

For second-order coupling, the required index modulation must be nearly quadrupled in order to obtain coupling coefficients of the same magnitude. And, although the periods (14 and 16) in the second-order grating is roughly twice that of the first-order grating, the optimum grating feature (24) size is only slightly larger. Also, second-order gratings have the advantage of more relaxed fabrication tolerances. However, this must be weighed against the disadvantage of considerably larger $\Delta n$ and the possibility of losses due to diffraction into surface-emitting modes. Whether a first-order or second-order grating is preferable therefore depends on practical details of the laser, the laser fabrication, and also on its intended application. For the purposes of the following discussion, a first-order grating is used.

The tilted-stripe geometry of the gain stripe (26) shown in FIG. 1 has its long (z) axis aligned with the short side of the primitive unit cell in real space and its short (x) axis aligned with the long side of the same unit cell. This orientation is required to obtain the maximum efficiency of the laser device, although small misalignments of the gain stripe (26) with respect to the photonic lattice do not appreciably affect other laser characteristics. Since local index fluctuations induced by the variation of the carrier density through the LEF are suppressed by the lossy regions (38 and 39) surrounding the gain stripe (26), this configuration allows Fabry-Perot-like modes to propagate through the laser cavity without interacting with the very narrow grating resonance. The weakly gain-guided structure of FIG. 1 can be made strongly gain-guided by preventing gain due to "secondary" pumping of the regions (38) outside of the gain stripe by the emitted photons. This is accomplished by fabricating the laser with ion-bombarding regions that are not subject to appreciable "primary" pumping, or otherwise preventing gain in the regions outside the gain stripe (38 and 39) while maintaining the grating periodicity. However, it is detrimental to the laser performance if strong gain-guiding is induced by etching a mesa or otherwise interrupting the periodic modulation of the refractive index, since said periodic modulation extending beyond the gain stripe (26) is required to maximize the optical coherence across broad stripes. The present invention includes laser devices in which gain is created by either optical pumping or electrical injection.

The design method according to the present invention begins with the wave equation:

$$\frac{1}{n_m^2(r)}\nabla^2 E_y - \frac{1}{c^2}\frac{\partial^2}{\partial t^2}E_y = 0 \tag{1}$$

where E is the TE-polarized electric field, $n_m$ is the modal index at each point r in the laser plane, the strong confining effect of the waveguide along the growth direction is included, and all vectors and associated operators here and below represent 2D (i.e., in the x-z plane) quantities. The dispersion (apart from the variation of the optical gain) is not considered, although it can be included by using the group index in place of the modal index in appropriate places. For most lasers, the group index differs from the modal index by a relatively weak correction of no more than a few percent.

An operating wavelength is selected to achieve the optimum beam quality or cohesion and power spectrum. The wavelength, $\lambda_c = 2\pi c/\omega_0$, is selected to match the peak of the gain spectrum of the laser active region, since this is generally the most advantageous condition. Optimally detuning may be carried out to reduce the value of the linewidth enhancement factor (LEF), if so desired.

A waveguide structure, which typically includes an active layer, top and bottom cladding layers, and a separate confinement layer, must be selected. The selection of the active region (or cavity) of the laser is based upon a consideration of the LEF and the internal loss factor. A dielectric constant and a complex carrier contribution C (which is a function of the carrier density N) are associated with the active region. The dielectric constant can be expanded in terms of plane waves, and the result can be conveniently written down as follows:

$$\frac{n_0^2}{n_m^2(r)} = \sum_G \hat{\kappa}(G)e^{iG\cdot r} + in_0\frac{c}{\omega_0}\hat{G}(r,N) \tag{2}$$

where $n_0$ is the average modal index in the absence of carriers, $n_m$ is the modal index at each r in the laser plane, G represents reciprocal lattice vectors, and $\kappa$ represents the 2D plane-wave expansion of the normalized dielectric constant. The carrier contribution (assumed to be much smaller than the real part of the modal index) may be written out explicitly as: $\hat{G} = \Gamma g(1-i\alpha) - \alpha_i$, where $\Gamma$ is the confinement factor obtained from the 1D eigenvalue calculation, $g(r,N)$ is the material gain, $\alpha$ is the LEF, and $\alpha_i$ is the internal loss. After factoring out the fast spatial variation in the electric field introduced by the 2D periodic pattern, a slow-varying function $a_k(r, t)$, which is governed by the active carrier distribution and boundary conditions, is left:

$$E(r,t) = \sum_G a_{k+G}(r,t)e^{i[(k+G)\cdot r - \omega t]} \tag{3}$$

where E is the electric field, and k is the wave vector.

Substituting these elements into the wave equation, the following equations for the TE-polarized optical field $$\sum_{G} \hat{\kappa}(G-G')[(k+G)\cdot(k+G')a_{k+G'} - i(2k+G+G')\cdot\vec{\nabla}a_{k+G'} - \nabla^2 a_{k+G'}] = \left[\frac{\omega_0^2}{c^2}n_0^2 - i\frac{\omega_0}{c}n_0\hat{G} + i\frac{2\omega_0}{c^2}n_0^2\frac{\partial}{\partial t}\right]a_{k+G} \quad (4)$$

and for TM-polarized light $$\sum_{G'} \hat{\kappa}(G-G')[|k+G'|^2 a_{k+G'} - i(2k+G+G')\cdot\vec{\nabla}a_{k+G'} - \nabla^2 a_{k+G'}] = \left[\frac{\omega_0^2}{c^2}n_0^2 - i\frac{\omega_0}{c}n_0\hat{G} + i\frac{2\omega_0}{c^2}n_0^2\frac{\partial}{\partial t}\right]a_{k+G} \quad (5)$$

can be obtained. In principle, these equations can be applied to any photonic-crystal device. The only assumption made is the existence of a reasonably slow variation (in time and space) of the envelope function. The key simplification in the subsequent analysis is that the refractive index perturbation introduced by the grating features (24) is assumed to be small enough that the expansion of the equations for TE- and TM-polarized light can be accurately carried out using a very limited number of reciprocal lattice vectors G. The accuracy of this assumption is excellent as long as $\Delta n/n_0$ is no larger than a few percent. It is further assumed that the unperturbed modal index $n_0$ is constant, although lateral and longitudinal variations are easily incorporated. An invariant grating period (14 and 16) and shape (24) is also assumed, although the etch depth can be varied. The cavity length (28) is specified by $L_c$.

The index perturbation characteristic of the PCDFB lasers in the geometry of FIG. 1 is small, so only components corresponding to the following four vectors are considered: $P_1=\{1/2, m/2\}$ (30), $-P_1=\{-1/2, -m/2\}$ (32), $P_2=\{-1/2, m/2\}$ (34), and $-P_2=\{1/2, -m/2\}$ (36), where the notation $\{l,m\}$ defines the order of diffractive coupling in terms of primitive reciprocal lattice vectors. That is, $\{l,m\}=lb_1+mb_2$, $b_1=2\beta(\sin\theta, 0)$, and $b_2=2\beta(0, \cos\theta)$, where $\beta=\pi/(\Lambda_2 \cos\theta)$ is the diagonal distance from the center to the corner of the 1st Brillouin zone. Expanding the propagation vectors in terms of reciprocal lattice vectors: $\pm P_{1,2}=(k+G_{\pm 1, \pm 2})$, it is straightforward to obtain: $k=\{1/2, 1/2\}$, $G_1=\{0,0\}$, $G_{-1}=\{-1,-1\}$, $G_2=\{-1,0\}$, and $G_{-2}=\{0,-1\}$ for the $\{1,1\}$ coupling order; $k=0,0\}$, $G_1=\{1,1\}$, $G_{-1}=\{-1,-1\}$, $G_2=\{-1,1\}$, and $G_{-2}=\{1,-1\}$ for the $\{2,2\}$ coupling order; $k=\{1/2, 1/2\}$, $G_1=\{1,0\}$, $G_{-1}=\{-2,-1\}$, $G_2=\{-2,0\}$, and $G_{-2}=\{1,-1\}$ for the $\{3,1\}$ coupling order, etc. The four propagation directions have non-zero coupling if the corresponding vctors: (1) have equal amplitude $|k+G_i|=|k+G_j|$ and (2) are connected by some reciprocal lattice vector $G_j-G_i$. For example, coupling orders with l+m equal to an odd integer have only two equivalent directions because of condition (1). Similarly, any four equivalent directions that correspond to non-integer l, m do not fulfill condition (2). The implication is that the coupled propagation directions for any non-trivial rectangular PCDFB lattice point along diagonals of the Wigner-Seitz cell, i.e., l>0, m>0, and l+m=2, 4, 6, . . . .

When coupling orders with l=m and substituting the vectors $\pm P_{1,2}$ into Eq. (4), the following equations are obtained for the TE polarization:

$$(k_0^2 n_0^2 - ik_0 n_0 \hat{G} - \beta^2 m^2)a_1 + 2ik_0 n_0 \frac{n_0}{c}\frac{\partial a_1}{\partial t} + 2i\beta m\left(\cos\theta\frac{\partial a_1}{\partial z} + \sin\theta\frac{\partial a_1}{\partial x}\right) + \frac{\partial^2 a_1}{\partial x^2} + \frac{\partial^2 a_1}{\partial z^2} = 2m[-\kappa_1 \beta \bar{a}_1 + \kappa_2 \beta\cos(2\theta)a_2 - \kappa_3 \beta\cos(2\theta)\bar{a}_2] \quad (6)$$

$$(k_0^2 n_0^2 - ik_0 n_0 \hat{G} - \beta^2 m^2)a_2 + 2ik_0 n_0 \frac{n_0}{c}\frac{\partial a_2}{\partial t} + 2i\beta m\left(\cos\theta\frac{\partial a_2}{\partial z} - \sin\theta\frac{\partial a_2}{\partial x}\right) + \frac{\partial^2 a_2}{\partial x^2} + \frac{\partial^2 a_2}{\partial z^2} = 2m[-\kappa_1 \beta \bar{a}_2 + \kappa_2 \beta\cos(2\theta)a_1 - \kappa \beta\cos(2\theta)\bar{a}_1] \quad (7)$$

where $k_0=2\pi/\lambda_c=\omega_0/c$ and $a_1$, $\bar{a}_1$, $a_2$, $\bar{a}_2$ stand for the field components corresponding to $\pm P_{1,2}$. For $\bar{a}_1$ and $\bar{a}_2$, analogous expressions may be written that differ from Eqs. (6) and (7) only in the signs of the sin θ and cos θ terms (the signs follow the convention adopted for $\pm P_{1,2}$). Terms proportional to $\kappa_i \equiv m(\beta/2) \kappa(G_{\kappa i})$ that involve derivatives are neglected, since they are expected to be much smaller than the retained terms on the right-hand side. Similar equations hold for the TM polarization with the following substitutions: $\kappa_1 \rightarrow -\kappa_1$, $\kappa_2 \cos(2\theta) \rightarrow \kappa_2$, $\kappa_3 \cos(2\theta) \rightarrow -\kappa_3$.

The coefficients $\kappa_1$, $\kappa_2$, $\kappa_3$ correspond to the coupling from $P_1$ (30) to $-P_1$ (32), $P_2$ (34), and $-P_2$ (36), respectively, as well as the other couplings that are equivalent by symmetry., In other words, $\kappa_1$ accounts for DFB-like distributed reflection (by 180°), $\kappa_2$ represents the effect of diffraction by an angle 2θ from the "nearly-horizontal" Bragg planes, and $\kappa_3$ quantifies the diffraction by an angle (180°−2θ) from the "nearly-vertical" Bragg planes. For purely real κ (i.e. negligible modulation of the cavity loss by the grating), the following is obtained:

$$\kappa_i = \frac{2\pi \Delta n}{\lambda}\frac{1}{a_L}\int_R d^2 x \exp(-iG_{\kappa i}\cdot r) \quad (8)$$

where i=1, 2 or 3, Δn is the amplitude of the index modulation, R is the grating feature (24) area, $a_L$ is the area of the primitive cell of the reciprocal lattice, and $G_{\kappa 1}=|G_1-G_{-1}|=|G_2-G_{-2}|$, $G_{\kappa 2}=|G_1-G_2|=|G_{-1}-G_{-2}|$, $G_{\kappa 3}=|G_1-G_{-2}|=|G_{-1}-G_2|$. Equation (8) can easily be generalized to the case of complex coupling by setting the imaginary part of Δn proportional to Δg or $\Delta a_i$. For the circular grating features (24) of radius r, shown in FIG. 1:

$$\kappa_i = \frac{2\pi \Delta n}{\lambda}\frac{\pi r^2}{\Lambda_1 \Lambda_2}\frac{2J_1(G_{\kappa i}r)}{G_{\kappa i}r} \quad (9)$$

The optical gain g and the LEF $\alpha=-4\pi/\lambda$ $(dn_m/dN)/(dg/dN)$ in $G=\Gamma g(1-i\alpha)-\alpha_i$ are functions of the carrier density N at each point in the laser plane. A simplifying approximation, that the diffusion length is much smaller the typical scale of the variation of the envelope function, is used here to calculate the carrier density. This approximation is accurate in some cases of interest such as mid-IR quantum well lasers and will, in any case, not influence the main findings.

Recombining all carriers at the same spatial position where they were generated by the electrical injection provides:

$$\frac{\partial N}{\partial t} = \left[ \frac{j(x,z)}{Med} - c_A N^3 - R_{sp}(N) - \right. \tag{10}$$

$$\left. \frac{\Gamma g(N)}{\hbar \omega} (|a_1|^2 + |\bar{a}_1|^2 + |a_2|^2 + |\bar{a}_2|^2) \right]$$

where $c_A$ is the Auger coefficient, $R_{sp}$ is the spontaneous emission rate, j is the injection current density, M is the number of periods (quantum wells) in the active region, and d is the thickness of one period of the active region. The cross-terms that would appear in the parentheses are negligible owing to their fast spatial variation. For optical pumping, the first term in brackets should be replaced by $I_a(Md\hbar\omega_{pump})$, where $I_a$ is the pump intensity absorbed in the active region and $\hbar\omega_{pump}$ is the pump photon energy. The optical gain may be conveniently parameterized in terms of differential gain and transparency carrier density, which in this design method are accurately calculated by incorporating complete energy dispersion relations and matrix elements derived from a finite-element 8-band k·p algorithm or other band structure computation approaches. Any increase in the carrier or lattice temperature due to pumping of the active region is neglected, since this is an acceptable approximation under many conditions of interest. The inclusion of heating effects will alter only the quantitative details and will not influence the main design rules with regard to the photonic crystal.

The design process can be simplified by making the assumption that the center wavelength has been chosen so that $k_0 n_0 = m\beta$ [i.e., the periodicity of the photonic lattice should be chosen so that $\Lambda_2 = m\lambda_c/(2n_0 \cos \theta)$]. A further assumption is that the angle θ (12) is relatively small. However, the aspect ratio (tan $\theta = \Lambda_2/\Lambda_1$) cannot be too small, since the transverse coherence is lost in that case. On the other hand, for TE-polarized modes if the aspect ratio is too large (close to 45°), the coupling coefficients decrease. In that case, the beam corresponding to the $P_1$ direction (30) propagates at such a large angle to the gain stripe (26) that much of the light is lost from the edges of the stripe. For a given laser structure, the novel theoretical formalism outlined below will allow the determination of the optimal angle θ (12) that yields the best balance between efficiency and beam quality.

Another assumption is that the spatial variation of the envelope is relatively slow, i.e., mβ cos $$\theta \frac{\partial a}{\partial z} \gg \frac{\partial^2 a}{\partial z^2}.$$

With these assumptions, four coupled time-dependent traveling-wave equations that are linear in both the time derivative and the propagation-axis spatial derivative are obtained.

In the configuration shown in FIG. 1, the facets (18 and 20) are aligned with one of the axes. In order to make the treatment of the boundary conditions consistent with this, the following rotation by the angle θ (12) is applied:

$$x = \frac{x'}{\cos\theta} + z \tan\theta \tag{11}$$

thereby aligning a facet with the x' axis. In performing this transformation, second-order partial derivatives that tend to be small are discarded, since they represent a slow variation. In spite of the great complexity presented by a 3-dimensional (2 spatial and 1 time) problem, the judicious simplifications introduced above make it tractable when solved by a split-step prescription that is known to be useful in the time-domain modeling of 1D DFB lasers. This is described in "An efficient split-step time-domain dynamic modeling of DFB/DBR laser diodes", B.-S Kim et al., IEEE J. Quantum Electron. Vol. (2000) and "Dynamic analysis of radiation and side-mode suppression in a second-order DFB laser using time-domain traveling-wave model", L. M. Zhang et al., IEEE J. Quantum Electron. Vol. (1994), which are incorporated herein by reference. A further simplification is effected by using a beam-propagation-like fast Fourier transform (FFT) algorithm that has been employed in the precise treatment of diffraction and coupling effects in α-DFB lasers. This is described in "Fast-Fourier-transform based beam-propagation model for stripe-geometry semiconductor lasers: Inclusion of axial effects", G. P. Agrawal, J. Appl. Phys., Vol. (1984), which is incorporated herein by reference.

The novel time-dependent algorithm of the present invention will now be described, using the rectangular lattice shown in FIG. 1. A uniform rectangular mesh with separations $\Delta x'$ and $\Delta z$ can be chosen such that the design remains stable and convergent. In the absence of spontaneous emission, laser oscillation will not commence if the starting field intensity is zero. The spontaneous emission noise amplitude is generated using a pseudorandom number generator with a Gaussian random-variable distribution. The noise satisfies the following correlation:

$$\langle s(x',z,t)s^*(x',z',t') \rangle = \tag{12}$$

$$\hbar\omega_0 \beta_{sp} M R_{sp}(x',z,t) \frac{n_0}{c} \delta(t-t')\delta(z-z')$$

The fraction of the spontaneous emission that is coupled into the modes of the optical field is taken to be $\beta_{sp} = 10^{-4}$. Assume that the noise terms are the same for all field components.

The inventive design method also incorporates the spectral roll-off of the optical gain using a series expansion in powers of ($\omega - \omega_0$) [up to the quadratic term], where $\omega_0$ is the gain spectrum's peak frequency, which can then be transformed into the time domain:

$$g(\hbar\omega) \approx g_0 \left[ 1 - \left( \frac{\hbar\omega - \hbar\omega_0}{\Delta\hbar\omega_g} \right)^2 \right] \Rightarrow g(t) \approx g_0 \left[ 1 + \frac{1}{(\Delta\omega_g)^2} \frac{\partial^2}{\partial t^2} \right] \tag{13}$$

Here $g_0$ is the peak gain and $\Delta\hbar\omega_g$ is the parameterized width of the gain spectrum as defined in Eq. (13). This expression is widely used since even multi-mode lasing usually occurs only close to the gain peak. Using an approximate conversion of the time derivatives into spatial derivatives, the following equation is obtained:

$$\frac{1}{(\Delta\omega_g)^2}\frac{\partial^2 a}{\partial t^2} \Rightarrow \left(\frac{n_0}{c\Delta\omega_g}\right)^2 \frac{a(x',z+\Delta z,t)-2a(x',z,t)+a(x',z-\Delta z,t)}{(\Delta z)^2} \quad (14)$$

Following the split-step prescription of Kim et al., and applying it to two-dimensional PCDFB structures, the effect of gain and carrier-induced index variations on the counter-propagating field components at time t is computed to provide the characteristic matrix, $M_{dc}$ as follows:

$$\begin{bmatrix} a_1(x',z+\Delta z,t) \\ \bar{a}_1(x',z,t) \\ a_2(x',z+\Delta z,t) \\ \bar{a}_2(x',z,t) \end{bmatrix} = \begin{bmatrix} e^{\hat{G}\Delta z\cos\theta/2} & 0 & 0 & 0 \\ 0 & e^{\hat{G}\Delta z\cos\theta/2} & 0 & 0 \\ 0 & 0 & e^{\hat{G}\Delta z\cos\theta/[2\cos(2\theta)]} & 0 \\ 0 & 0 & 0 & e^{\hat{G}\Delta z\cos\theta/[2\cos(2\theta)]} \end{bmatrix} \begin{bmatrix} a_1(x',z,t-\Delta t) \\ \bar{a}_1(x',z+\Delta z,t-\Delta t) \\ a_2(x',z,t-\Delta t) \\ \bar{a}_2(x',z+\Delta z,t-\Delta t) \end{bmatrix} \quad (15)$$

where $\Delta t=\Delta z(n_0/c)$.

Disregarding the gain terms, perform a Fourier transformation of the field components with respect to the lateral spatial coordinate $$\tilde{a}(\mu,z,t)=\int d\mu a(x',z,t)\exp(i\mu x') \quad (16)$$

and rewrite the coupled equations in the following form:

$$\pm\frac{\partial \tilde{a}}{\partial z}+\frac{\cos\theta n_0}{c}\frac{\partial \tilde{a}}{\partial t}=iM_{dc}\tilde{a}=i\begin{bmatrix} -\frac{\mu^2}{2\beta m\cos\theta}-\mu\sin\theta & -\kappa_1' & -\kappa_2' & -\kappa_3' \\ -\kappa_1' & \frac{\mu^2}{2\beta m\cos\theta}+\mu\sin\theta & -\kappa_3' & -\kappa_2' \\ -\frac{\kappa_2'}{\cos(2\theta)} & -\frac{\kappa_3'}{\cos(2\theta)} & \frac{-\mu^2/(2\beta m\cos\theta)+\mu\sin\theta}{\cos(2\theta)} & -\frac{\kappa_1'}{\cos(2\theta)} \\ -\frac{\kappa_3'}{\cos(2\theta)} & -\frac{\kappa_2'}{\cos(2\theta)} & -\frac{\kappa_1'}{\cos(2\theta)} & \frac{-\mu^2/(2\beta m\cos\theta)-\mu\sin\theta}{\cos(2\theta)} \end{bmatrix} \quad (17)$$

$$\begin{bmatrix} \tilde{a}_1(\mu,z,t) \\ \tilde{\bar{a}}_1(\mu,z,t) \\ \tilde{a}_2(\mu,z,t) \\ \tilde{\bar{a}}_2(\mu,z,t) \end{bmatrix}$$

where $M_{dc}$ is the characteristic matrix, $\kappa_1'\equiv-\kappa_1\cos\theta$, $\kappa_2'\equiv\kappa_2\cos(2\theta)\cos\theta$, and $\kappa_3'\equiv-\kappa_3\cos(2\theta)\cos\theta$ for TE-polarized light. For TM-polarized light, the factors of $\cos(2\theta)$ should be omitted in the definitions of $\kappa_2'$ and $\kappa_3'$, and the minus signs are omitted in the definitions of $\kappa_1'$ and $\kappa_3'$. In the case of complex coupling, complex conjugates of the appropriate coefficients should be employed in the lower triangular part of the matrix. In writing Eq. 17, ignore the slightly different factors of proportionality in front of the time derivative for different field components in order to make the problem more tractable. The error becomes large only when θ is close to 45°, a case that is not important to the PCDFB. In the limit θ→0°, and for TE-polarized light as θ→45° (square lattice): $\kappa_2'\approx\kappa_3'\to 0$. Furthermore, if the $\Lambda_2$ periodicity is removed, the α-DFB case is recovered with two oscillating waves coupled via $\kappa_2'$ ($\kappa_1'=\kappa_3'=0$). In that case, the matrix in Eq. 17 can be split into two 2×2 sub-blocks, which represent complete decoupling of the forward- and backward-propagating beams. On the other hand, if θ=0° (or Δn=0), only the diagonal terms survive. Solving for two counter-propagating components, the algorithm presented here is then equally applicable to the problem of gain-guided (broad-area) semiconductor lasers without a corrugation.

In the second stage of the split-step algorithm, analytically integrate $$\pm\frac{\partial \tilde{a}(\mu,t)}{\partial z}=iM_{dc}\tilde{a}(\mu,t):$$

$$\begin{bmatrix} \tilde{a}(\mu,z+\Delta z,t) \\ \tilde{\bar{a}}(\mu,z,t) \end{bmatrix} = X_{dc}\exp(i\Lambda_{dc})X_{dc}^{-1}\begin{bmatrix} \tilde{a}(\mu,z,t) \\ \tilde{\bar{a}}(\mu,z+\Delta z,t) \end{bmatrix} \quad (18)$$

where $\Lambda_{dc}$ is a diagonal matrix containing the eigenvalues of the "diffraction-coupling" characteristic matrix $M_{dc}$ as entries, and $X_{dc}$ is a matrix containing the eigenfunctions of $M_{dc}$. This operation is preceded and followed by FFT transformations. For real Δn, the procedure expressed in Equation 18 is unitary, i.e., it conserves the total power in the cavity. The operations in Equations 15 and 18 are performed for each time step $\Delta t$.

Equations 15 and 18 embody the prescription for propagation of the optical field. At each spatial position in the cavity at time t, numerically integrate Equation 10 simultaneously with the field propagation, which provides values for the gain and LEF consistent with the optical field. For the preferred embodiment, the gain stripe (26) is aligned or nearly aligned with the z axis. When applying boundary conditions, it is a good approximation to neglect the reflected $a_2$ components, which enter the cavity at large angles to the original direction:

$$a_1(x',L) = \sqrt{R} \overline{a}_1(x',L_c); \quad \overline{a}_1(x',0) = \sqrt{R} \overline{a}_1(x',0); \quad a_2(x',L_c) = 0; \quad a_2(x',0) = 0. \tag{19}$$

Therefore, at the facets (18 and 20), the $a_2$ component is taken to be zero.

The power emitted from a given facet (22) is determined by integrating the near-field profile $a_2(z=L_c)$ or $\overline{a}_2$ (z=0) over the gain stripe (26):

$$P(I_a) = (1-R) \int dx' |a_1(x', z=0, L_c)|^2 \tag{20}$$

The far-field emission characteristic may be determined from the near-field profile $a_2(z=L_c)$ or $\overline{a}_2$ (z=0) using the Fraunhofer diffraction theory.

The spectral properties of the laser output (22) may be obtained from the power spectrum of the optical field, which is a Fourier transform of the autocorrelation function $\Psi$:

$$\Psi(\tau, x') = \frac{1}{T} \int_0^T dt a_1^*(x'; z=0, L_c; t+\tau) a_1(x'; z=0, L_c; t) \tag{21}$$

Here the time T must be long enough to capture the relevant detail of the laser spectrum. The power spectrum should be averaged over the lateral (x') direction in order to sample the spectral properties of the entire emitting aperture. In order to obtain steady-state values for all of the derived quantities, switch on the PCDFB laser and then wait until all of the turn-on transients have dissipated. For the results discussed here, convergence with respect to the mesh pitch and the time window T have been demonstrated to occur.

The LEF ($\alpha$) is defined as the ratio between the carrier-induced variations of the real and imaginary parts of the linear optical susceptibility. While the ratio varies somewhat with carrier density, at low temperatures and densities it may be considered constant. The plasma contribution to the refractive index, which scales as the square of the wavelength, should be included into the calculation of the differential index in the numerator. The LEF is calculated at the lasing photon energy, since it is a spectral function, and apart from the plasma contribution vanishes at the peak of the differential gain. The mismatch between the peak gain, where lasing occurs barring strong spectral selectivity of the cavity loss, and the peak differential gain is the immediate cause of a non-zero LEF in a semiconductor laser, and is itself a consequence of the asymmetric conduction and valence-band densities of states in the active region. The LEF can be thought of as a measure of the focusing ($\alpha$<0) or defocusing ($\alpha$>0) of the optical wave induced by a positive carrier-density perturbation. In a region where spatial hole burning leads to a slight local decrease of the carrier density, a positive LEF induces self-focusing, which is ultimately responsible for filamentation. The product ($\Gamma g_{th} \alpha$) of the threshold gain ($\Gamma g_{th}$), which includes contributions due to the mirror loss, internal loss, and diffraction loss, and the LEF ($\alpha$) is typically the most critical parameter that limits the beam quality and spectral purity of high-power single-mode lasers, including the PCDFB. The correct inclusion of the LEF into the treatment of the beam quality and spectral characteristics of PCDFB lasers is essential to performing a reliable design analysis.

The appropriate loss for a given laser and set of operating conditions should be determined self-consistently, since the internal loss can depend on the pumping conditions and the diffraction loss depends on the mode propagation properties. While, in principle, both the internal loss and the diffraction loss depend in a complicated way on spatial position within a given laser cavity, the variations tend to be relatively small and in evaluating the optimal PCDFB parameters, it is adequate to employ average values. Several of these different possibilities will be considered. The criterion for placing a given laser in one of the categories will be the product of the threshold modal gain $\Gamma g_{th}$ and the LEF $\alpha$, where $\Gamma g_{th}$ is equal to the sum of the internal loss, facet-reflectivity loss, and diffraction loss associated with the grating. The diffraction loss in a single-mode PCDFB laser can range roughly from 10 cm$^{-1}$ to 30 cm$^{-1}$ depending on the stripe width and emission wavelength.

The inventive method can be used to design lasers in a number of different classes. One class concerns lasers with a large $\Gamma g_{th} \alpha (\geq 100$ cm$^{-1})$, examples of which include double-heterostructure or even some quantum-well interband lasers operating at high carrier densities or with a strongly broadened gain spectrum, particularly in the mid-IR. Another class concerns lasers with intermediate values of the $\Gamma g_{th} \alpha$ product (on the order of several tens of cm$^{-1}$), an example of which is an InP-based quantum-well laser designed to operate in the telecommunications wavelength range of 1.3–1.55 $\mu$m, in which no special measures are taken to reduce the LEF). A third class includes lasers with small values of $\Gamma g_{th} \alpha (\leq 20$ cm$^{-1})$, examples of which are low-loss/low-LEF GaAs-based lasers, quantum-dot (QD) lasers and quantum cascade lasers (QCLs). All of these device classes are typically designed to emit TE-polarized light, with the exception of the QCL, which is limited solely to TM-polarized light emission.

Figure 2:
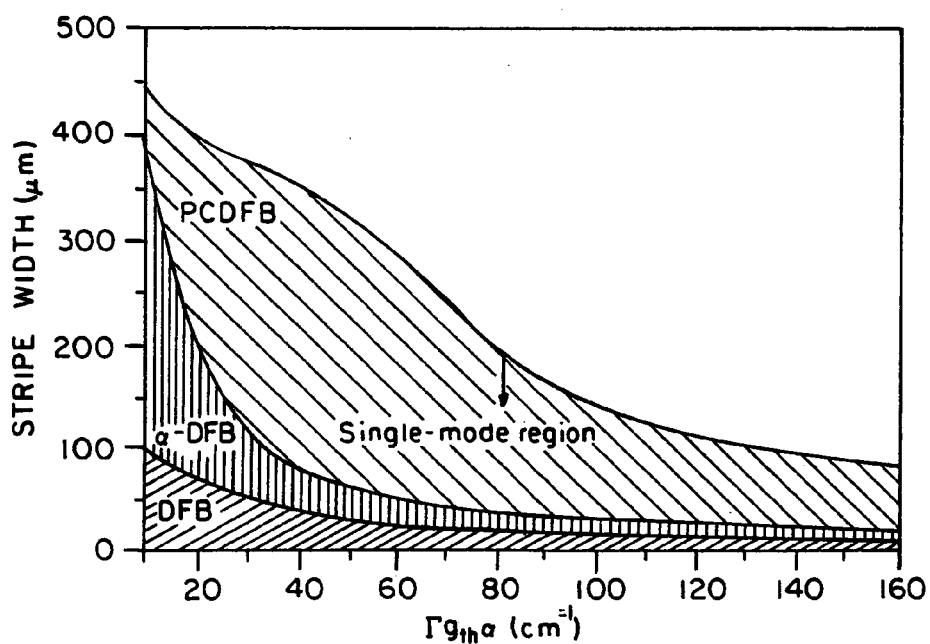
FIG. 2 shows a contour plot of the single mode operation regions as a function of pump stripe and $\Gamma g_{th}\alpha$ product for a 1D DFB laser (black), an $\alpha$-DFB laser (gray), and an optimized PCDFB Laser (light gray).

The inventive design method provides a beam output for the selected elements of rectangular lattices, where the highest single-mode power can be obtained by using $16° \leq \theta \leq 23°$ for a wide range of $\Gamma g_{th} \alpha$. In a lattice with square or circular grating features (24), it is difficult to obtain a value of $\kappa_3'$ that is much different from $\kappa_1'$, and the difference between them has relatively little effect on the PCDFB laser performance. For definiteness, unless otherwise specified, $|\kappa_3'|=|\kappa_1'|$ (but note that the exact value of $\kappa_3'$ is not critical). Furthermore, the highest single-mode power can be obtained for a cavity length $L_c$ (28) of at least 1.5 mm (for most devices the upper limit may be about 2.5 mm due to practical considerations) with only a weak dependence on $\Gamma g_{th} \alpha$. For a rectangular-lattice PCDFB, the maximum stripe width ($W_{max}$) which can maintain single-mode operation as a function of the $\Gamma g_{th} \alpha$ product is shown in FIG. 2. This dependence is relatively insensitive to the wavelength and other details of a given laser, although in self-consistently determining the $\Gamma g_{th} \alpha$ product it must be remembered that the diffraction loss scales approximately with wavelength.

Whereas various grating orders higher than first ({1,1} in the notation defined above) may be used, the refractive index perturbation required to obtain the same coupling coefficients in the optimized range is larger for higher-order couplings, and the possible waveguide loss source due to out-of-plane emission must be considered. A further important consideration is the possibility of accidental degeneracies between two resonances with different m and l. For example, when $\theta=\tan^{-1}(7^{-1/2}) \approx 20.7°$, i.e., in the optimized grating angle (12) range, the resonance wavelengths for the {2,2} and {5,1} grating-order resonances of the rectangular lattice coincide. A general relation for the grating angle $0<\theta \leq 45°$ for which the {l,m} and {l',m'} grating orders are in resonance is as follows:

$$\theta = \tan^{-1}\sqrt{\frac{m^2 - m'^2}{l'^2 - l^2}} \quad (22)$$

Possible near-degeneracies are to be avoided if stable operation in a single mode is desired. On the other hand, in some cases it may be desirable to intentionally cause the lasing wavelength to controllably hop from one grating resonance to another by means of tuning the peak of the gain spectrum with temperature or pump intensity/current density. When the gain spectrum is positioned in between two resonances, simultaneous highly coherent lasing at two separated wavelengths corresponding to the resonances can be obtained. This discrete-tuning/two-color laser approach based on two nearly degenerate resonances of the rectangular lattice also falls within the scope of this invention.

In the case of lasers with a large LEF ($\geq 100$ cm$^{-1}$), a hexagonal lattice confers no advantage, because at such large $\Gamma g_{th}\alpha$ the coherence is lost at relatively narrow stripe widths, and the decrease in efficiency more than offsets the improvement in the beam quality. A rectangular lattice with $16° \leq \theta \leq 23°$ and $|\kappa_3'| \approx |\kappa_1'|$ is therefore optimal. The inventive method demonstrates that the maximum single-mode power can be obtained when $1.5 \leq |\kappa_1'|L_c \leq 2.5$ (or 8 cm$^{-1}$ $\leq |\kappa_1'| \leq 15$ cm$^{-1}$ in the preferred embodiment with 1.5 mm $\leq L_c \leq 2.5$ mm). The results of the optimized design that are shown in FIG. 2 imply that for large LEF/$\Gamma g_{th}\alpha$, the maximum stripe widths are $\leq 150\,\mu$m, and the best operation is obtained for 150 cm$^{-1}$ $\leq |\kappa_2'| \leq 250$ cm$^{-1}$ (which corresponds to $2.0 \leq |\kappa_2'|W \leq 2.5$). Thus the PCDFB optimization mandates that relatively large coupling coefficients be used when $\Gamma g_{th}\alpha$ is large. For m=1, these results imply that the optimum side of the square grating feature (24) is 0.9–0.95 $\Lambda_2$, while for m=2, a$\approx$0.55 $\Lambda_2$. For the example of an optically pumped mid-IR "W" laser with $L_c$=2 mm and $\lambda$=4.6 $\mu$m, the maximum stripe (26) width for which single-mode output can be obtained is$\approx$100 $\mu$m. The external quantum efficiency is then 55% of that for a Fabry-Perot laser with the same parameters, while the beam quality and spectral purity are far superior.

For the range 40 cm$^{-1} \leq \Gamma g_{th}\alpha \leq 100$ cm$^{-1}$, the optimal $|\kappa_1'|L_c$ falls in the range 1–2 (corresponding to 4 cm$^{-1} \leq |\kappa_1'| \leq 15$ cm$^{-1}$), the maximum stripe (26) width is 150–350 $\mu$m, as seen from FIG. 2, and the otimal $\kappa_2'$ is in the range 60–150 cm$^{-1}$ ($1.5 \leq |\kappa_2'|W \leq 2.5$). For m=1, these results imply that the optimum side of the square is 0.85–0.9 $\Lambda_2$, while for m=2, a$\approx$0.57–0.58 $\Lambda_2$.

When $\Gamma g_{th}\alpha$ is lower, the required inter-feature spacing decreases somewhat. For a rectangular lattice with $\Gamma g_{th}\alpha \leq 40$ cm$^{-1}$, the TDFT simulations yield optimal results for $|\kappa_3'| \approx |\kappa_1'|$, 2 cm$^{-1} \leq |\kappa_1'| \leq 10$ cm$^{-1}$ ($0.5 \leq |\kappa_1'|L_c \leq 1.5$), 350 $\mu$m $\leq W_{max} \leq 450$ $\mu$m, and 30 cm$^{-1} \leq |\kappa_2'| \leq 60$ cm$^{-1}$ ($1.3 \leq |\kappa_2'|W \leq 2.1$). For m=1, these results imply that the optimum side of the square is 0.8–0.85 $\Lambda_2$, while for m=2, a$\approx$0.6 $\Lambda_2$.

The preceding configuration specifications are based on the objective of maximizing the single-mode output power by maximizing the stripe (26) width. However, these specifications should be modified if good (but not necessarily diffraction-limited) multi-mode beam quality is a more important objective than spectral purity. To achieve that objective the coupling coefficients should be reduced somewhat. For $\Gamma g_{th}\alpha \geq 100$ cm$^{-1}$, $1.5 \leq |\kappa_1'|L_c \leq 2$ (6 cm$^{-1} \leq |\kappa_1'| \leq 13$ cm$^{-1}$) is optimal, while $1 \leq |\kappa_1'|L_c \leq 1.5$ (4 cm$^{-1} \leq |\kappa_1'| \leq 10$ cm$^{-1}$) is optimal for 40 cm$^{-1} \leq \Gamma g_{th}\alpha \leq 100$ cm$^{-1}$, and $0.5 \leq |\kappa_1'|L_c \leq 1.5$ (2 cm$^{-1} \leq |\kappa_1'| \leq 10$ cm$^{-1}$) is optimal for $\Gamma g_{th}\alpha \leq 40$ cm$^{-1}$. For all $\Gamma g_{th}\alpha$, it is optimal to employ $0.5 \leq |\kappa_2'|W \leq 1.5$ when the best beam quality is the overriding objective.

Figure 3:
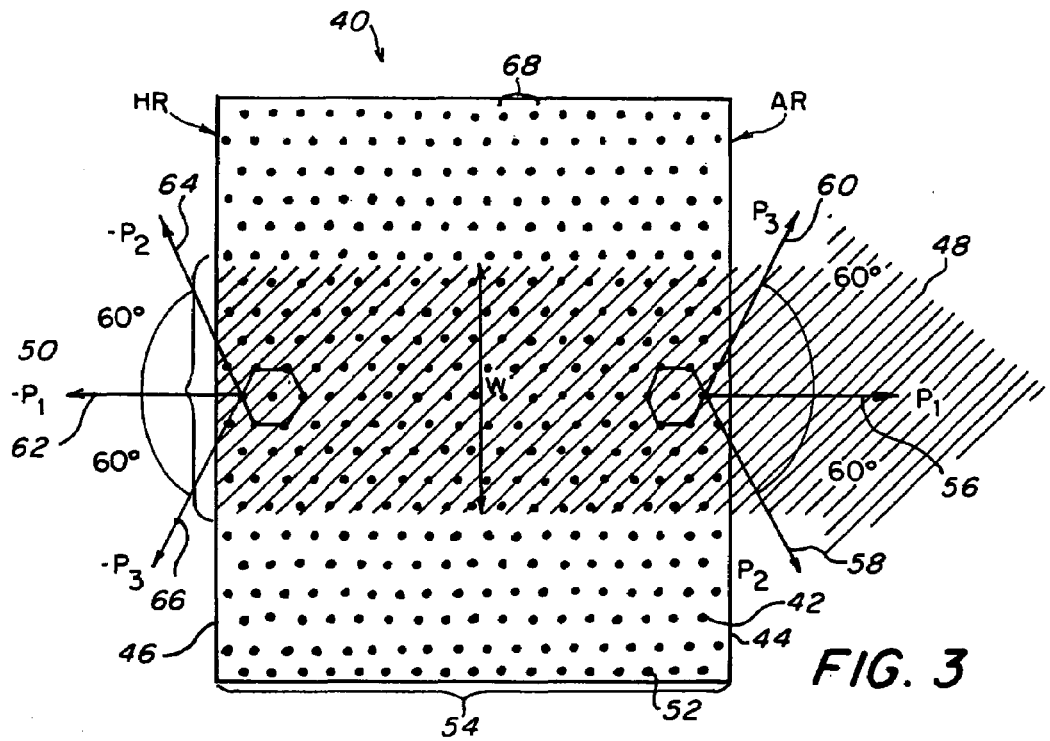
FIG. 3 shows a schematic representation of the hexagonal-lattice PCDFB laser having circular grating features and three propagation axes, with $P_1$ being the output direction.

The present invention is not limited to designing the PCDFB laser type with a rectangular lattice geometry (10). Other laser types and geometries are included without departing from the scope of the present invention. For example, a hexagonal geometry (40) may be used for the photonic crystal instead of the rectangular lattice geometry (10) discussed as part of the preferred embodiment. This configuration is shown in FIG. 3. Instead of two equivalent propagation directions, there are now three [$P_1$=(0, 1) (56); $P_2$=($\sqrt{3}/2$, 1/2) (58); and $P_3$=($-\sqrt{3}/2$, 1/2) (60)], so that six distinct components of the optical field must be considered. In addition, the gain stripe (50) is aligned with $P_1$ (56), and the laser facets (44 and 46) are perpendicular to $P_1$ (56). Thus apart from the pattern of the grating features (42), the hexagonal-lattice PCDFB laser is somewhat simpler because the gain stripe (50) is not tilted with respect to the facets (44 and 46). However, in the absence of coatings, the hexagonal geometry (40) is generally less attractive for lasers with a large LEF. This is due to microscopic refractive-index fluctuations which will favor parasitic Fabry-Perot-like modes that propagate between the facets (44 and 46) without being significantly affected by the narrow grating resonance, thereby robbing power from the desired resonant mode and degrading the overall beam quality. Moreover, in the hexagonal geometry (40), transverse coherence is established by beams that propagate at $\pm 60°$ to $P_1$ (56) This means that diffraction losses will be high unless the gain stripe (50) is relatively wide. Using the inventive design method for a gain medium with a small LEF-threshold gain product, such as a quantum cascade laser employing intersubband transitions or a low-loss GaAs-based laser, the hexagonal-lattice PCDFB (40) produces a lasing mode with the highest degree of optical coherence when the pump stripe (50) is very wide. For gain media with a small LEF-threshold gain product, it will therefore be advantageous over all other geometries, including the rectangular-lattice PCDFB (10), when the objective is to maximize the output laser beam (48) power that can be emitted into a single optical mode with high spectral purity and near-diffraction-limited beam quality. This has not been proposed previously for edge-emitting semiconductor lasers.

Distinct hierarchies of coupling orders are obtained, which depend on the orientation direction. Considering first propagation along the $\Gamma$-J direction in reciprocal space (see FIG. 3), the first two orders with coupling at the J point [$\beta=(4/3)\pi/\Lambda$ and $\beta=(8/3)\pi/\Lambda$], where $\Lambda$ is the period (68) of the hexagonal lattice (40), allow coupling between only three directions at angles of 120° to each other (e.g. $P_1$ (56), $P_{-2}$ (64) and $P_{-3}$ (66)) due to Condition 2 (which was described earlier). On the other hand, the third and fourth J-point orders admit coupling between all six equivalent directions. For coupling occurring at the X point of the reciprocal lattice, there are also two kinds of diffractive orders: 1) with two opposite propagating directions only [e.g., $\beta=(2\sqrt{3}/3)\pi(2l+1)/\Lambda$, l=0, 1, 2, . . . ] and 2) with four equivalent propagation directions (here, the coupling resembles that in a rectangular lattice with $\theta=30°$). For the six-fold coupling that takes place at the $\Gamma$ point with propagation vectors pointing along the $\Gamma$-X directions, with $k=\beta(0,0)$, where $\beta=(4\sqrt{3}/3)m\pi/\Lambda$ and $\Lambda$ is the period of the hexagonal lattice [$\Lambda=(2\sqrt{3}/3)m\lambda_c/n_0$, m=1, 2, 3, . . . ], the relevant reciprocal lattice vectors are: $G_1=2\beta(0,1)$, $G_{-1}=2\beta(0,-1)$, $G_2=2\beta(\sqrt{3}/2,1/2)$, $G_{-2}=2\beta(-\sqrt{3}/2,-1/2)$, $G_3=2\beta(-\sqrt{3}/2,1/2)$, and $G_{-3}=2\beta(\sqrt{3}/2,-1/2)$.

Returning to the $\Gamma$-X orientation, there are three distinct coupling coefficients, which can be calculated from an expression similar to equation (3). A convention is adopted whereby $\kappa_1$ corresponds to coupling straight back (e.g., 180° rotation, from $P_1$ to $P_{-1}$, etc.), $\kappa_2$ is the coefficient responsible for diffraction by a 60° angle (e.g., from $P_1$ to $P_2$, $P_1$ to $P_3$, or $P_{-2}$ to $P_3$), and $\kappa_3$ is the coefficient responsible for diffraction by a 120° angle (e.g., from $P_1$ to $P_{-2}$, $P_1$ to $P_{-3}$, or $P_2$ to $P_{-1}$). In order to implement the inventive time-dependent Fourier transform (TDFT) approach, an approximation, $$\beta \frac{\partial a}{\partial z} \gg \frac{\partial^2 a}{\partial z^2},$$

is employed. Note that neglecting the second derivative in z is an essential feature of all TDFT calculations. Fortunately, for cases where the spatial coherence of the optical beam is relatively strong, this approximation is expected to be very good. The results of the analysis for the hexagonal lattice (40) can then be written in terms of the characteristic matrix $M_{dc}$, defined as in Equation 17 except that the cos θ term on the left-hand side is omitted:

$$M_{dc} = \begin{bmatrix} -\mu^2/(2\beta) & -\kappa_1 & -\kappa_2 & -\kappa_3 & -\kappa_2 & -\kappa_3 \\ -\kappa_1 & -\mu^2/(2\beta) & -\kappa_3 & -\kappa_2 & -\kappa_3 & -\kappa_2 \\ -2\kappa_2 & -2\kappa_3 & -\mu^2/\beta-\mu\sqrt{3} & -2\kappa_1 & -2\kappa_3 & -2\kappa_2 \\ -2\kappa_3 & -2\kappa_2 & -2\kappa_1 & -\mu^2/\beta+\mu\sqrt{3} & -2\kappa_2 & -2\kappa_3 \\ -2\kappa_2 & -2\kappa_3 & -2\kappa_3 & -2\kappa_2 & -\mu^2/\beta+\mu\sqrt{3} & -2\kappa_1 \\ -2\kappa_3 & -2\kappa_2 & -2\kappa_2 & -2\kappa_3 & -2\kappa_1 & -\mu^2/\beta-\mu\sqrt{3} \end{bmatrix} \quad (23)$$

Equation (23) is applicable to TM-polarized light with $\bar{a}\equiv\lfloor\bar{a}_1 \bar{a}_{-1} \bar{a}_2 \bar{a}_{-2} \bar{a}_3 \bar{a}_{-3}\rfloor$, whereas the same expression with coefficients $\kappa_2$ and $\kappa_3$ reduced by a factor of 2 and $\kappa_1 \rightarrow -\kappa_1$, $\kappa_3 \rightarrow -\kappa_3$ holds for TE-polarized light. Although inaccuracies in the treatment of the time derivatives for the $P_2$ (58) and $P_3$ (60) beams become somewhat larger here than in the rectangular-lattice case, that can be at least partly mitigated by employing a finer mesh. The treatment of the time variation for the $P_1$ beam (56), which is the source of the normal emission from the facets, is exact.

For $\Gamma g_{th}\alpha \leq 20$ cm$^{-1}$, higher single-mode output powers and better beam qualities are attainable using the hexagonal lattice (40) of FIG. 3 rather than a rectangular lattice (10) such as that in FIG. 1. To achieve the maximum single-mode power, $\kappa_1 L_c \approx 1$ should be employed. However, in the $\Gamma g_{th}\alpha \leq 20$ cm$^{-1}$ region, the hexagonal lattice (40) is preferable to a rectangular lattice (10) when the stripe width (50) becomes wider than about 800 $\mu$m, although quite high single-mode output powers can be obtained with narrower stripes (50). The maximum stripe (50) width for which single-mode operation is expected is about 1.5 mm, for coupling coefficients in the range 20 cm$^{-1}\leq|\kappa_2|$, $\kappa_3|\leq 60$ cm$^{-1}$. The $\kappa_2$ and $\kappa_3$ coefficients are nearly equal in the preferred embodiment and larger than $\kappa_1$ by at least a factor of 3. Since the period $\Lambda$ (68) of the hexagonal lattice (40) is fixed by the desired resonance wavelength $\lambda$, the index-modulation-amplitude is the only other variable parameter in the lateral extent of the grating features (42). Circular grating features (42) are preferred in the case of a hexagonal lattice (40), since when the grating feature (42) shape departs from a circle, the coupling between different waves becomes non-equivalent. More than three coupling coefficients would be required to describe the operation of the device, and the performance would be expected to suffer to some extent (although the hexagonal lattice (40) may still be advantageous over a rectangular lattice (10) if for practical reasons it is more convenient to fabricate grating features (42) that are not strictly circular). Fortunately, a wide variety of different κ sets can be realized by using circles alone, fr which the radius is related to the filling fraction via $F=(2\pi/\sqrt{3})r^2/\Lambda^2$. The $|\kappa_2|\approx|\kappa_3|>\kappa_1$ condition can also be realized using the lowest-order six-fold coupling at the $\Gamma$ point with the diameter of the circular region being about 90–97% of the length of the period, i.e., the adjacent grating features (42) are nearly touching. The performance of the device is relatively insensitive to variations in the circle diameter of no more than a few percent. The optimized configurations range from $|\kappa_1'|=2$ cm$^{-1}$, $|\kappa_2'|=|\kappa_3'|=7$ cm$^{-1}$, $L_c=1$ mm for W=2.8 mm to $|\kappa_1'|=2$ cm$^{-1}$, $|\kappa_2'|=|\kappa_3'|=25$ cm$^{-1}$, $L_c=480$ $\mu$m for W=0.8 mm to $|\kappa_1'|=10$ cm$^{-1}$, $|\kappa_2'|=|\kappa_3'|=120$ cm$^{-1}$, $L_c=300$ $\mu$m for W=100 $\mu$m (we set a limit of $L_c=300$ $\mu$m on the minimum cavity length). These coupling coefficients are realized by using the lowest-order resonance along the $\Gamma$-X direction and varying the fill factor of circular grating features (42). Considerably smaller cavity (54) lengths ($\approx 1$ mm) are required to achieve the best beam quality in hexagonal-lattice devices (40) for the following reasons: (1) the gain stripe (50) is not tilted, so a longer cavity (54) less effectively discriminates against Fabry-Perot-like modes owing to the smaller associated threshold gain of those modes; and (2) the $P_2$ (58) and $P_3$ (60) beams propagate at rather large angles of ±60° with respect to the cavity (54) axis, which implies that a large aspect ratio between the stripe (50) width and the cavity (54) length is expected to yield the maximum brightness.

One version of the PCDFB laser with the parameters slightly outside the range of optimal values has been reduced to practice. A piece of antimonide laser material with an InAs/GaInSb/InAs/AlAsSb "W" quantum-well active region and GaSb top separate-confinement region was patterned by optical lithography into a second-order rectangular-lattice photonic-crystal configuration (10) in accordance with the main approach of the invention but with grating parameters falling outside the required ranges due to limitations of the available optical lithography. The grating was second-order to allow larger grating features (24) and permit patterning with optical lithography, although better optimized first-order gratings may be created by electron-beam lithography. Reactive ion etching into the top GaSb layer produced 90-nm-deep circular grating features (24) on a rectangular lattice (10). Following thinning of the substrate, laser facets were cleaved to a cavity length of about 2 mm. The photonic crystal was oriented at an angle of 20° relative to the facet normal, in accordance with the invention. The device was mounted epitaxial-side-up using thermal compound, and optical pumping was provided by 100-ns pulses from a Ho:YAG laser. The lasing wavelength was $\lambda$=4.6 $\mu$m, and the operating temperature at which the gain spectrum matched the photonic-crystal resonance was 183 K.

Although the spectrum was not single mode, because the grating did not have optimized parameters and also because the pulsed excitation induced chirp associated with carrier and lattice heating, the spectrum was nonetheless a factor of 4–10 narrower than that of a Fabry-Perot laser made from the same wafer, and also narrower than earlier "W" lasers emitting in the same wavelength region. Proper working of the PCDFB device was confirmed because the peak wavelength varied only weakly with temperature, which was expected since the wavelength is determined primarily by the photonic-crystal resonance condition rather than by the peak wavelength of the gain spectrum. On the other hand, the output wavelength for an earlier $\alpha$-DFB laser made from the same material varied rapidly with temperature, following the gain peak, and also displayed little spectral narrowing. It should be noted that there was also a near degeneracy of the {2,2} and {5,1} grating-order resonances that was discussed above in connection with Eq. (22). This led to the simultaneous observation of both resonant wavelengths at some intermediate temperatures.

The beam quality, as quantified in terms of the etendue (basically, the product of the output beam's divergence angle and its effective aperture size) was also substantially improved over the earlier $\alpha$-DFB device. The etendue for the PCDFB laser was smaller at all pump-stripe (26) widths, and the difference was as large as a factor of 5 at stripe widths of 200 $\mu$m and above. This represents a substantial improvement over an unpatterned Fabry-Perot geometry. These tests of a non-optimized version of the invention confirm that the PCDFB laser operates in the intended mode, and also that it displays narrower spectral linewidth and improved beam quality over the prior available designs. Further details are given in a journal article published by the inventors with experimental collaborators, W. W. Bewley, C. L. Felix, I. Vurgaftman, R. E. Bartolo, J. R. Lindle, J. R. Meyer, H. Lee, and R. U. Martinelli, "Mid-infrared photonic-crystal distributed-feedback lasers with improved spectral purity and beam quality", Appl. Phys. Lett., vol. 79, pp. 3221–3223 (2001)), which is incorporated herein by reference.

Figure 4:
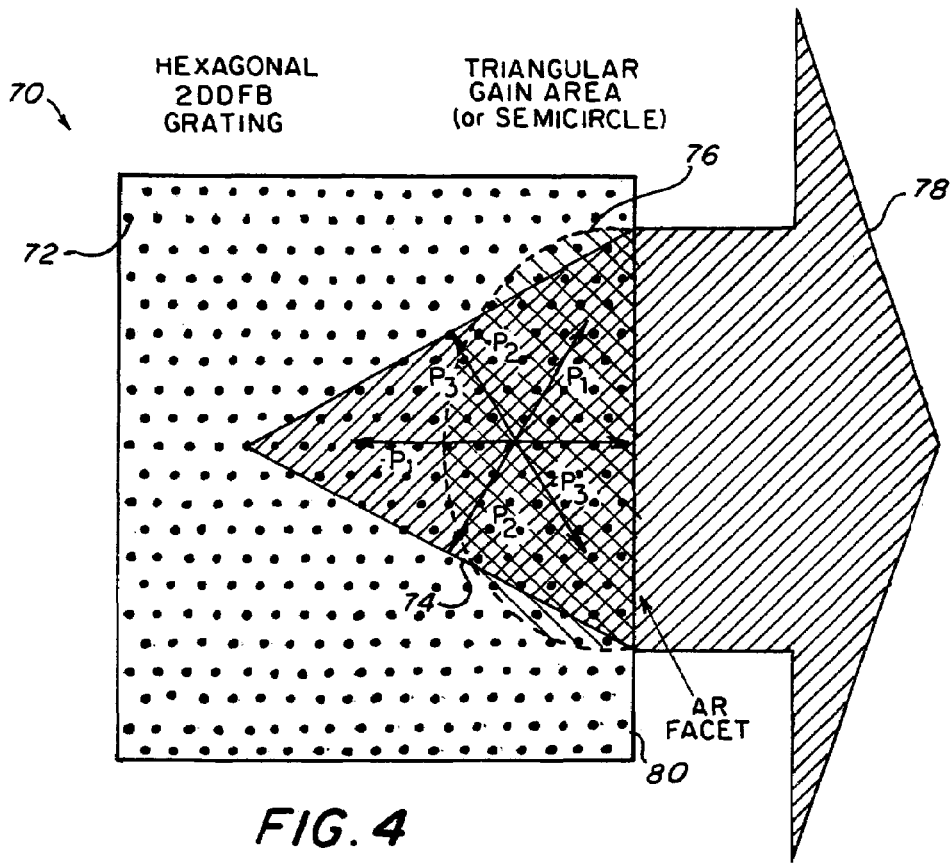
FIG. 4 shows a schematic representation of a single-facet hexagonal-lattice PCDFB laser according to the present invention.

The present invention includes lasers built using the specification produced by this design method. However, the present invention also includes lasers constructed with a particular grating configuration, and whose operation is made possible or is enhanced by the presence of the PCDFB grating. One of the unique configurations made possible by photonic crystals is an edge-emitting highly coherent broad-area laser (70) that requires only a single facet (80). An example of this configuration is shown in FIG. 4. A hexagonal-lattice PCDFB laser may be defined in the manner outlined in connection with FIG. 3. However, instead of pumping the entire area between two specially defined laser facets, only a roughly triangular (74) or roughly semicircular (76) area in the vicinity of the one facet (80) is pumped. In the preferred embodiment, the single required facet (80) is AR-coated. The product of the coupling coefficients and the radius (or the full spatial extent) of the pumped area (74 or 76) is kept at a reasonably large value that allows most of the light to be diffracted before reaching the boundary of the pumped region (74 or 76). Therefore, the numerical value for the product of any coupling coefficient and the full spatial extent of the pumped region should be no smaller than 2. The device shown in FIG. 4 operates by 2D feedback from the hexagonal grating. Some of the light oscillating inside the pumped area (74 or 76) is extracted from the facet (80). The emitted power is controlled by varying the spatial extent of the pumped area (74 or 76) and the ratio of the facet (80) surface to the circumference of the pumped area (74 or 76).

Figure 5:
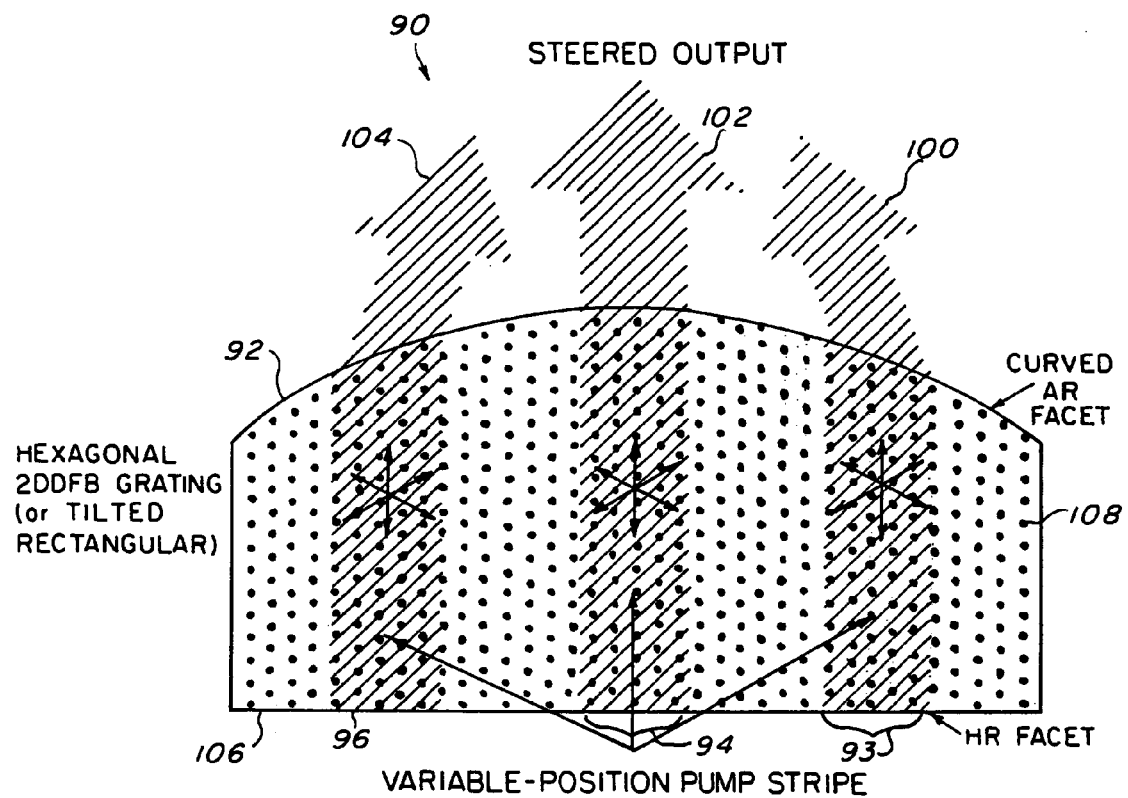
FIG. 5 shows a schematic representation of a laser with a hexagonal (or tilted rectangular) grating and a curved facet used for beam steering according to the present invention, wherein the output angle varies with the pump stripe position.

The high degree of spatial coherence provided by the hexagonal lattice may also be utilized for the purposes of beam steering as shown in FIG. 5 (90). In order to realize the beam-steering capability, one of the facets (92) of the hexagonal (FIG. 3) or tilted rectangular (FIG. 1) PCDFB lasers should be curved rather than planar. The desired degree of curvature may be realized by fabricating the facet (92) by etching rather than the cleaving technique routinely employed for edge-emitting semiconductor lasers. In the preferred embodiment, an AR coating is applied to the curved facet (which is assumed to have a constant radius of curvature) in FIG. 5, whereas an HR coating is applied to the flat facet (96) in the same figure. The gain stripes (93, 94, and 96 are examples) may then be located at various positions with respect to the curved facet (92). The moment of the radius of the curvature is much greater than the stripe (93, 94, or 96) width, so that the facet (92) curvature may be neglected within a single stripe (93, 94, or 96). If the stripe (94) is positioned to be perpendicular to the tangent to the curved facet (92), then the output beam (102) for that stripe will emerge at nearly normal incidence to the tangent. On the other hand, if the tangent makes some small angle $\phi_i$ with the normal to the axis of the stripe (93 and 96 are examples), the output beam (100 and 104 are the corresponding output beams) will also be emitted at a non-zero angle $\phi_e$ with respect to the normal to the tangent. The emission angle $\phi_e$ is amplified with respect to $\phi_i$ by the modal refractive index of the laser waveguide, in accordance with Snell's law. It is possible to maintain lasing in the stripes at an angle with the normal to the tangent to the curved facet (92) surface, since the distributed feedback eliminates the need for facet reflections in the PCDFB structure. This allows beams from individual stripes (93, 94, and 96) to be steered over a relatively large range of angles with the ultimate constraints on its bounds imposed by the collection efficiency. The gain stripes (93, 94, and 96) may be defined by electrical contacts or by optical pumping. In the former case, no special fabrication procedure apart from the definition of the photonic crystal and the curved facet (92) is necessary, and it is possible to use a single pump beam to obtain emission at a wide range of angles.

Figure 6:
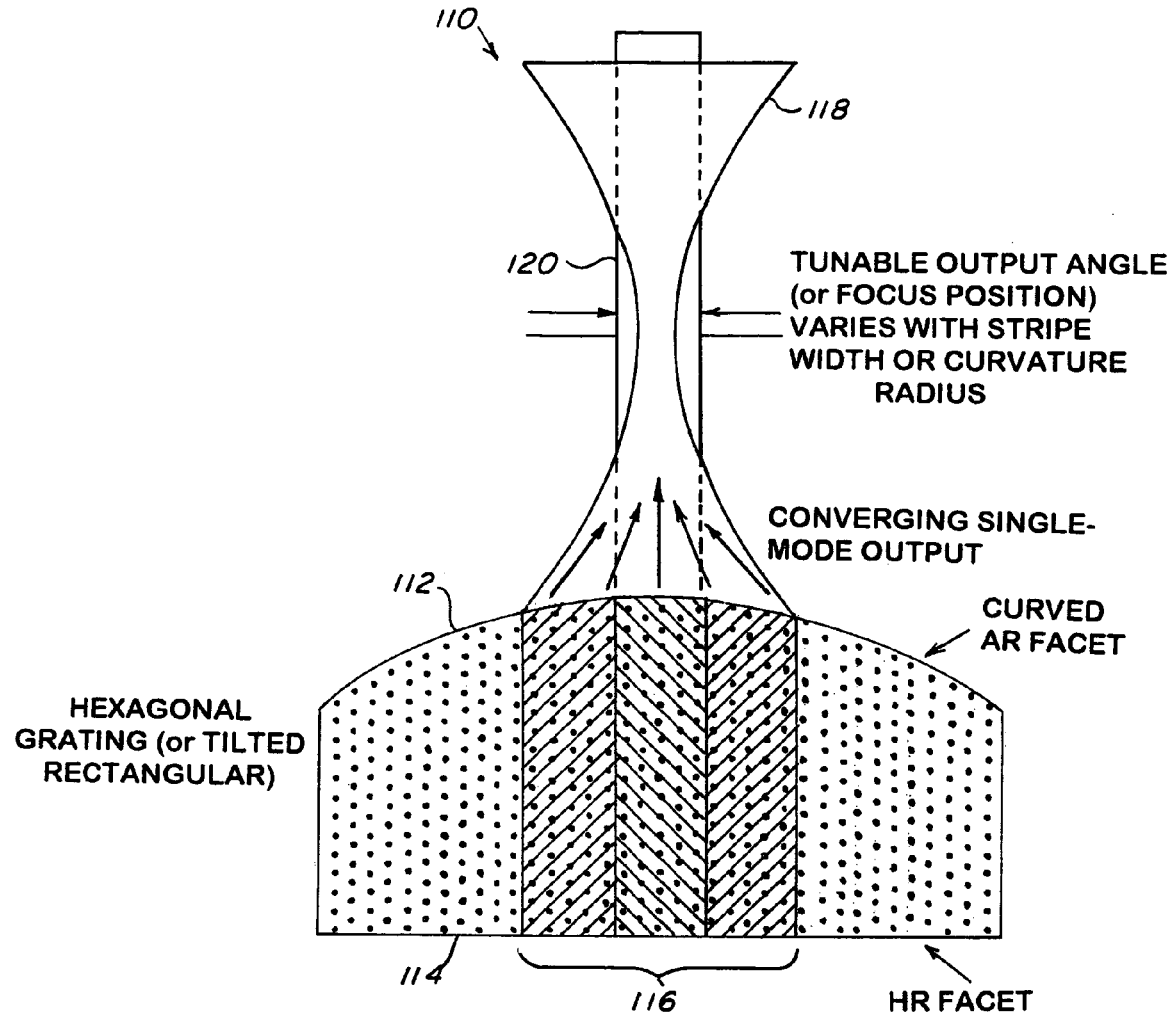
FIG. 6 shows a schematic representation of a laser with a converging output according to the present invention, wherein the radius of curvature is comparable to the stripe width and the laser is tuned to fast-axis angle for near-circular output.

In FIG. 6, the configuration (110) includes a radius of curvature of the facet (112) that is comparable to the stripe (116) width, with the single stripe (116) having a variable width. In the preferred configuration, the stripe (116) width is varied by optical pump beams with different pump spots. The stripe (116) is assumed to be perpendicular to the tangent of the curved facet (112), so that when the stripe (116) is relatively narrow, the output beam (118) will emerge nearly at normal incidence as discussed in the previous paragraph. As the stripe (116) width is increased, the different parts of the coherent wavefront of the lasing beam (118) near the curved facet (116) will be diffracted into free space outside the facet at different angles as required by Snell's law. Owing to the strong lateral coherence, the net effect is that the emitted beam converges towards a focal point (120) at some distance away from the curved facet (112). This distance is determined by the relation between the facet (112) curvature and the stripe (116) width in a unique manner. Beyond the focal point (120), the beam (118) diverges while maintaining a beam quality close to the diffraction limit. This ability to vary the angle of convergence and the focal point is important for a number of practical applications.

Figure 7:
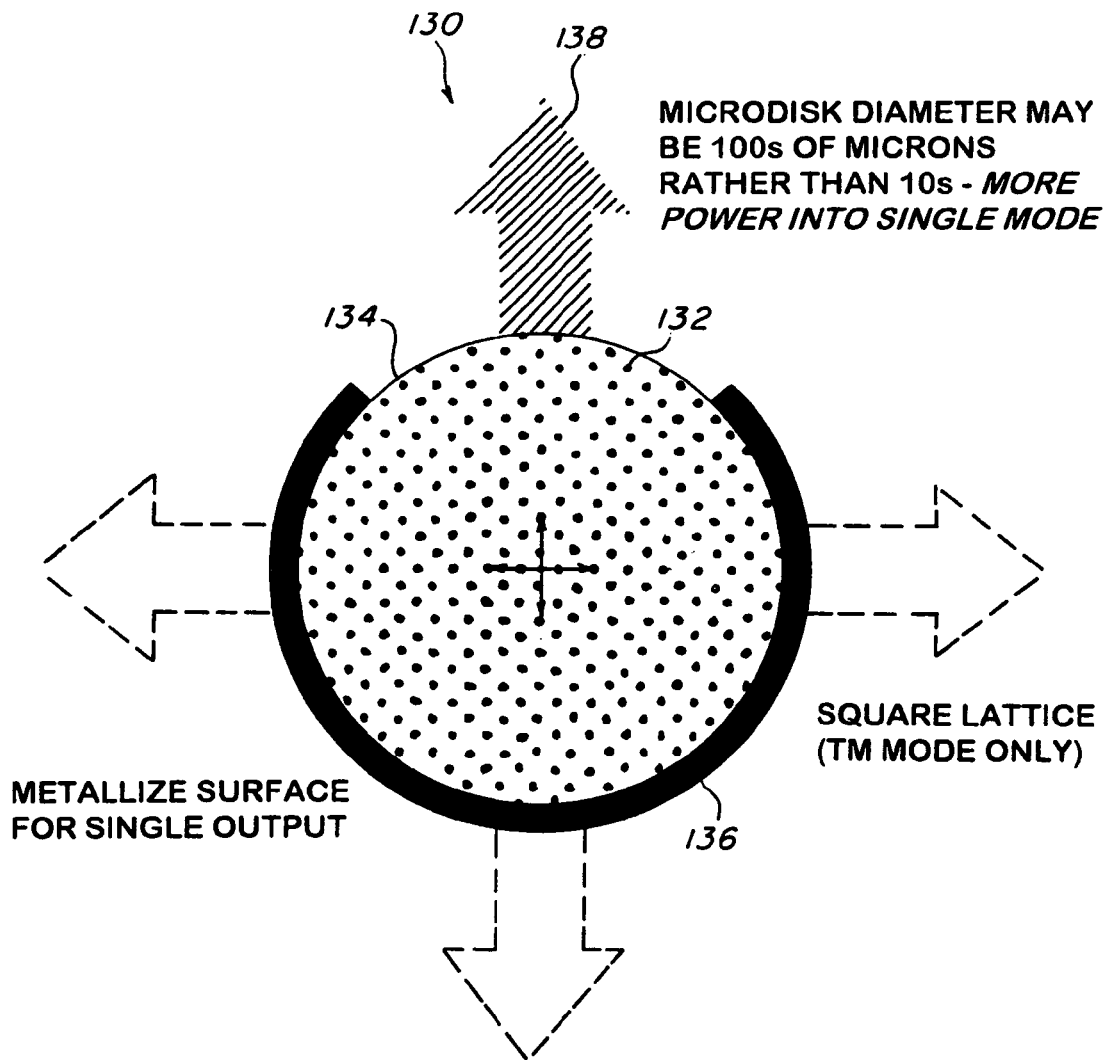
FIG. 7 shows a schematic representation of a microdisk laser according to the present invention with a higher efficiency for smaller and larger diameters than conventional microdisks.

Another configuration (130) builds on the microdisk laser concept familiar to those skilled in the art. Feedback in a microdisk laser is provided by glancing reflections from the circular lateral boundary of the device's active region. If the disk diameter is too large (on the order of a few hundred microns), most of the area of the disk has little overlap with the lasing mode, which is localized near the boundary. Furthermore, the extraction of the light from the microdisk laser is problematic, insofar as only a small fraction of the oscillating light is capable of escaping from the disk via photon tunneling. FIG. 7 shows a microdisk laser (130) that can effectively utilize the entire active area when its diameter is as large as several hundred microns. The microdisk laser of FIG. 7 allows a drastic enhancement in the power emitted into a single mode at the expense of defining a photonic-crystal grating (132) throughout the active area. The square lattice is preferred for the TM polarization. For the TE polarization, a hexagonal lattice with six equivalent directions should be used. Inside the microdisk, lasing proceeds in a manner that is similar to the other PCDFB configurations, and strong spatial and spectral coherence is maintained via multiple distributed-feedback processes as discussed in connection with the rectangular-lattice and hexagonal-lattice PCDFB lasers. Insofar as only a single emission direction is required for light extraction, in some embodiments the output power is maximized by reflecting the beams that would have emerged in the other three (five for the hexagonal lattice) directions. This may be accomplished by metallizing approximately three quarters (five sixths) of the active device area with the coating (136) oriented with respect to the grating as shown in FIG. 7, by incorporating Bragg gratings at the other three emission directions, or by other means. An AR coating may be applied to the remaining quarter of the device boundary (134).

The inventive grating configuration allows tunability to be built into the laser. Three new approaches to the tunability problem are presented: (1) multi-section wide-stripe tunable lasers; (2) photonic crystal lasers that are tunable by varying the angle that the lasing mode propagating along the cavity axis makes with the crystal lattice; and (3) PCDFB lasers with optically-tunable gratings. Within each of these approaches, there are a variety of alternative configurations.

Figure 8:
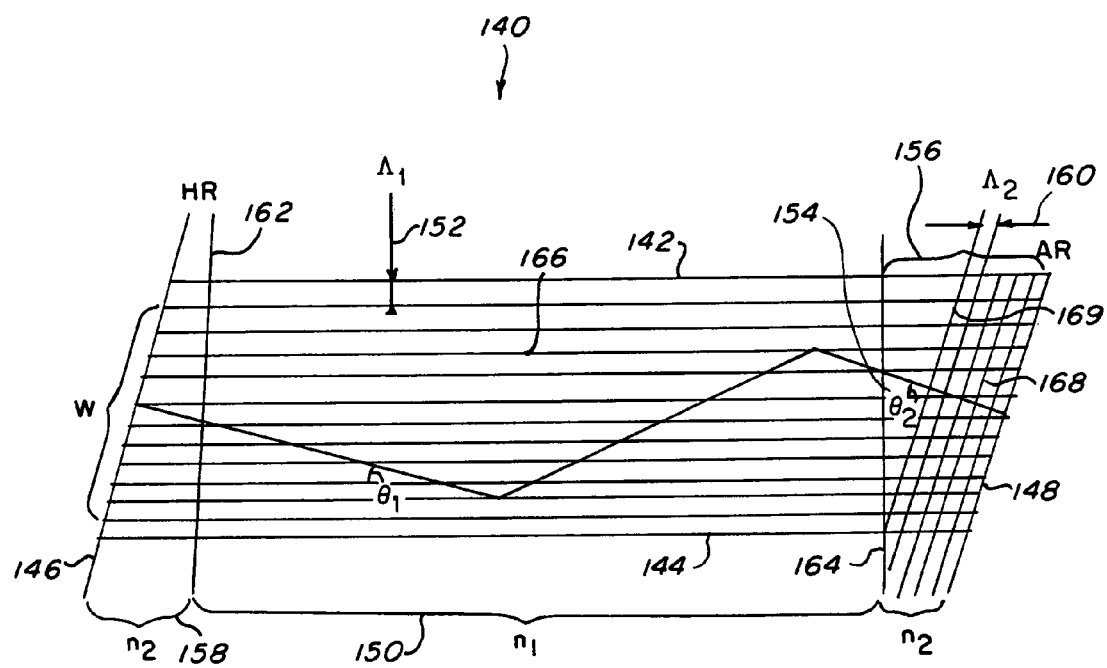
FIG. 8 shows a schematic representation of a multi-section wavelength-tunable PCDFB laser according to the present invention.

Referring to FIG. 8, a 2D photonic crystal with laser cavity is shown with facets (146 and 148) and a gain stripe bounded by the facets (146 and 148) and two edges (142 and 144). The laser cavity is divided into three sections: a first (PCDBR) tuning section (156 at the right of the figure), a central section (150), and a second tuning section (158, at the left of the figure). In both tuning sections (156 and 158), the modal refractive index is tunable via the applied voltage as will be discussed further below. Two or three separate electrodes (not shown) are used to inject carriers into these different cavity sections (150, 156, and 158). Although the following discussion assumes electrical injection, all of the configurations discussed here could alternatively operate by using two or three independently controllable optical pumping beams instead. In that case, a very precise alignment of the pump beams would be required owing to secondary pumping of the active material by lasing photons. Facets (146 and 148) appear at each end of the photonic crystal. The facets (146 and 148) of the device in FIG. 8 may be defined either by cleaving or by lithography, e.g., using reactive ion etching.

A central section (150) of the device comprises a first 1D grating with period ($\Lambda_1$, 152) that is defined by standard methods. The grating is inclined at some angle ($\theta_2$, 154) with respect to the facets, but is perpendicular to the boundaries of the central section (162 and 164). In a preferred embodiment, the angle $\theta_2$ (154) will be close to 20°. In the first tuning section at the right side of FIG. 8, an oblique-lattice 2D PCDBR mirror is defined in a preferred embodiment. The first grating (166) is continued into the first (right) tuning section (156) at the same orientation as in the central section (150). The oblique 2D lattice comprises a superimposed second grating (168), having period ($\Lambda_2$, 160) and an orientation that is parallel to the facets (146 and 148). In a preferred embodiment, the left boundary (164) of the first (right) tuning section (156) is perpendicular to the first grating (166) in the central region (150), while the left boundary (169) of the second (left) grating (168) is parallel to the facets (146 and 148). As is illustrated by FIG. 8, this leaves a triangular region that is covered by the right tuning electrode (not shown) but does not contain the second (2D) grating. In the preferred embodiment, an antireflection (AR) coating is applied to the right facet (148), and a high-reflectivity (HR) coating is applied to the left facet (146). However, the choice can also be made not to use coatings. In the preferred embodiment, the device is gain-guided, with all of the electrodes oriented so as to create a (nearly) continuous pump stripe of width W parallel to the first grating (166).

As photons are generated in the central section (150) by stimulated emission induced by application of the voltage $V_1$, they undergo Bragg reflections at the angle $\theta_1$ shown in the figure. This occurs when their wavelength is close to the grating resonance given by the relation: $\lambda_1 = 2\Lambda_1 \ n_1 \sin \theta_1$, where $n_1$ is the modal refractive index determined by the laser waveguide with confinement along the growth direction as well as by the injected carrier density in the central section (150). In the first tuning section (156, at the right of FIG. 8), the refractive index $n_2$ is controlled by varying the voltage, $V_2$, applied to that section. The resonance wavelength in the first tuning section (156) is $\lambda_2 = 2\Lambda_1 n_2 \sin \phi$. This is due to the fact that one of the superposed gratings in the first (right) tuning section is the first grating (166) (from the central section(150)) and therefore has the same period (152). In the first tuning section (156), the propagation angle $\phi$ must be equal to angle $\theta_2$ (154), the angle by which the grating is tilted with respect to facet (148) since the AR coating on the right facet (148) prevents any significant feedback from facet (148). Therefore, the necessary condition for assuring that feedback from the second (2D) grating (168) (at wavelength $\lambda_2 = 2 \Lambda_2 \ n_2$) returns along the original path of propagation (at an angle $\theta_2$ (154) with respect to the 1D grating (166)) is $\lambda_2=2\Lambda_1 n_2 \sin\theta_2$. These two expressions fix the relation between the two periods (152 and 160) as $\Lambda_2=\Lambda_1 \sin\theta_2$. Feedback occurs almost entirely along the original path as long as the length of the first tuning section (156) is shorter than the exchange length of the 1D grating (166) in the central section (150). Use Snell's law ($n_1 \sin\theta_1=n_2 \sin\theta_2$) at the interface between the two sections (150 and 156) to obtain the angle $\theta_1$ in terms of angle $\theta_2$ (a fixed structural parameter), $n_1$ (also fixed under any given set of operating conditions), and $n_2$ (which is controllable via $V_2$). Clearly the resonance wavelengths in the two sections (150 and 156) are identical ($\lambda_1=\lambda_2$), and the cavity mode closest to the resonance will experience the least loss, whereas other modes will be suppressed. The consequence is that the lasing wavelength may be controlled by $V_2$. In some cases it will be possible to tune the PCDBR resonant wavelength over the entire gain spectrum, e.g., by as much as $\pm 5\%$.

To tune the operating wavelength in the structure of FIG. 8, $n_1$ and angle $\theta_2$ remain nominally fixed, whereas $n_2$, angle $\theta_1$ and $\lambda$ are altered. In fact, angle $\theta_1$ and $\lambda$ are uniquely determined by the tuned-in value of $n_2$. The grating period $\Lambda_1$ (152) is selected so as to optimize the operation of the central region (150). For example, if the average value of the modal index in the tuning section (156) $\langle n_2 \rangle$ is assumed to be $n_1$: $\Lambda_1=\langle\lambda\rangle/(2 n_1 \sin\theta_2)$, the relation between the two periods (152 and 160) may be expressed as $\Lambda_2\equiv\Lambda_1 \sin\theta_2=\langle\lambda\rangle/(2 n_1)$. The use of a tilted grating in the central and first tuning sections allows the laser beam to maintain transverse coherence in that section. If only the second grating (168) with period $\Lambda_2$ (160) is utilized, the maximum single-mode stripe width would be reduced considerably, and the result would be a much lower single-mode output power.

In addition to the central section (150) and the first (right) tuning section (156), the preferred embodiment also includes a second tuning section (158) (shown to the left of central section in FIG. 8). The second tuning section (158) is oriented at angle $\theta_2$ (154) with respect to the HR-coated facet (146). The presence of the second tuning section (154) is desirable to insure that the laser beam strikes the HR-coated facet (146) at normal incidence. Since it is desired that the refractive indices in the first and second tuning sections (156 and 158) be the same ($n_2$), the applied voltages should be similar. However, a 1D grating (166) may be employed in the second tuning section (158), rather than a 2D grating (166 and 168) as is used in the first tuning section (156). It is also possible to use the second tuning section (158) for phase control by fine-tuning the refractive index in that section to a value that is slightly different from $n_2$. An alternative is to eliminate the second tuning section (158) and to rely on self-correction of the angle at the left facet (146).

This inventive configuration allows the output to emerge normal to a cleaved facet (148) irrespective of the wavelength, and also maintains coherence for quite wide gain-guided stripes. As a result, the attainable output powers are much higher than for any earlier wavelength-tunable single-mode semiconductor laser.

Some specific design requirements for the tunable PCDBR laser design of FIG. 8 follow. (1) The length ($L_1$) of the central section (150) may be chosen either to produce quasi-continuous tuning (in which case it will be long) or to enhance the differential efficiency (in which case it will be shorter), with preferred values being between 0.5 mm and 2.5 mm. (2) The coupling coefficient ($\kappa_a$) of the first (central) 1D grating (166), is determined by optimizing the high-power single-mode output corresponding to the width W of gain stripe. (3) The length ($L_2$) of the 2D grating in the first tuning section is then selected so that it is smaller than the exchange length associated with the first grating (166). In practice, $L_2$ should usually be in the 50–100 $\mu$m range since the exchange length is roughly given by $1/(2\kappa_a)$. (4) The lateral width of the first tuning section (156) is chosen so that the gain stripe completely overlaps the second grating (168). (5) The coupling coefficient, $\kappa_b$, of the second grating (168) is selected so as to maximize the efficiency of the device while maintaining sufficiently strong wavelength discrimination (e.g., $\kappa_b L_2$ of about 1 yields an effective reflectivity of approximately 50%). In most cases, $\kappa_a$ and $\kappa_b$ will be comparable and fall in the 50–300 cm$^{-1}$ range. This is in contrast to PCDFB devices, in which $\kappa_1'$ and $\kappa_3'$ are usually about an order of magnitude smaller than $\kappa 2'$, and typically fall in the 5–20 cm$^{-1}$ range.

A number of means exist for varying the refractive index, $n_2$, in the PCDBR section (156) over a large enough range to provide substantial wavelength tuning. The most straightforward method is to use the voltage applied to the PCDBR electrode (not shown) to modify the carrier density injected into the section (156). The maximum achievable carrier density will be limited by leakage (e.g., thermionic emission over the electron barriers), amplified spontaneous emission, and other mechanisms. The publication "Optimization of the carrier-induced effective-index change in InGaAsP Waveguides—Application to tunable Bragg filters", J. P. Weber, IEEE J. Quantum Electron. (1994). yielded an upper limit of 3–4×10$^{18}$ cm$^{-3}$ for InGaAsP-based devices operating at telecommunications wavelengths (1.3–1.55 $\mu$m). Preferably the energy gap in the active layer(s) of the tuning region (156) is large compared to the lasing photon energy, so that the first tuning region (156) is essentially transparent to the laser radiation. This is necessary to avoid equalization of the carrier densities in the central section (150) and the tuning section (156) by stimulated emission that would occur if the two energy gaps were roughly the same. In other embodiments, the index tuning rate may be enhanced by adding a contribution due to interband absorption in the first tuning section (156). For telecommunications lasers, appropriate InGaAsP-based layer structures have already been formulated and tested experimentally, although other material combinations would also be suitable. Different band gaps can be realized in sections by selective-area epitaxy, by other epitaxial regrowth techniques, or by etching away the small-gap layers in the tuning sections (156 and 158). Two InGaAsP active regions with slightly different compositions can be close in total thickness as well as in the refractive index, and therefore create only a small mismatch between the waveguide mode in the central region (150) and its continuation into the tuning section (156). Doping of the tuning layer (156) can also help to reduce the mode mismatch between the two sections (150 and 156).

For antimonide mid-IR lasers with higher electron barriers, the maximum carrier density will be on the order of the highest achievable doping density of nearly 10$^{19}$ cm$^{-3}$. The index tuning is enhanced significantly in longer-wavelength devices, since the plasma contribution to the refractive index increases as $\lambda^2$. The rate of relative wavelength tuning due to the plasma index shift near the center wavelength $\lambda$ is given by the following expression:

$$\frac{\Delta\lambda}{\lambda} = -0.0165\left(1+\frac{f_h}{f_e}\right)\Gamma_{SCH}\left(\frac{\Delta N}{10^{18}\,\text{cm}^{-3}}\right)\left(\frac{3.3}{n_1}\right)^2\left(\frac{0.04}{m^*}\right)\left(\frac{\lambda}{4\,\mu\text{m}}\right)^2 \quad (24)$$

where $f_h/f_e$, is the ratio of the electron-to-hole contributions to the refractive index, expected to be on the order of 10% even for equal densities of injected electrons and holes due to the much heavier hole mass, $\Delta N$ is the difference in the injected carrier densities in the two sections, which for mid-IR devices with high electron barriers can potentially be as high as $10^{19}$ cm$^{-3}$, and m* is the electron effective mass in the separate confinement heterostructure (SCH) layer into which the carriers are injected. Thus, for mid-IR devices the plasma contribution alone can shift the wavelength by nearly 400 nm, or 10%, of the wavelength when $\lambda=4\,\mu m$. If desired, the gain bandwidth can be artificially enhanced by employing multiple quantum wells with intentionally chirped well widths. The expected 10% variation in the refractive index corresponds to an angular modulation of angle $\theta_1$ by only about 2°, which will make the PCDBR tunable lasers quite robust. Wavelength-tunable antimonide mid-IR PCDBR structures have been designed in detail, and are found to combine large tuning ranges with high output powers.

The tuning which corresponds to a given injected carrier density may in some cases be enhanced by additionally making use of interband and intervalence absorption contributions to the refractive index. This is accomplished by positioning the energy gap or the split-off gap in the separate-confinement region of the laser waveguide sufficiently close to the photon energy, but not so close that the extra absorption reduces the efficiency of the device excessively.

The wavelength-tunable designs specified above do not necessarily require that a photonic crystal be used in the first tuning region (156). The main advantage of the PCDBR is simply that it allows optical coherence to be maintained over a much wider gain stripe, and therefore enables higher powers to be emitted into a single mode.

Many configurations other than the preceding multi-section wavelength-tunable PCDBR lasers (which used variability of the refractive index in the PCDBR tuning section) are possible. These include separable-grating schemes such as the sampled-grating technique in which a second DBR grating (168) is periodically interrupted by regions with zero coupling coefficients. The two DBR mirrors with slightly mismatched periods and a separate phase section produce extensive wavelength tuning by aligning distinct resonances in the two mirrors. This approach is particularly adaptable to the incorporation of the inventive PCDBR mirrors in place of the usual DBR mirrors, because the grating periods remain uniform (or nearly so). Other schemes based on superstructure gratings or chirped gratings can also be adapted, but present a greater cost in complexity since the periods of the first and second gratings must be varied simultaneously. In all of these cases, the maximum output power of the wavelength-tunable single mode is substantially enhanced when inventive PCDBR mirrors are employed because coherence can be maintained for a much wider stripe.

The fact that the output emerges along the normal to a facet, irrespective of the operating wavelength can be critical in applications where the laser light must be coupled into a fiber or other optical system, and where beam steering cannot be tolerated. The tunable PCDBR concept shares with multi-section DBR devices the possibility of broad-range tuning and is compatible with other proposed enhancements of the tuning range via modification of the second grating in FIG. 8. Furthermore, it is expected to outperform related configurations, in which either the first 1D or the 2D PCDBR section of FIG. 8 is omitted. In the former case, the maximum attainable single-mode power would be lower, since transverse coherence would be poorer in the PCDBR section. The latter case would represent a multi-section $\alpha$-DFB structure. The multi-section $\alpha$-DFB laser is less attractive than the multi-section PCDBR, since the cleaved facets in the $\alpha$-DFB case do not provide wavelength-sensitive feedback. The tuning mechanism would then be required to rely on the accuracy to which the angle $\theta_2$ would remain fixed as $n_2$ is varied. The PCDBR scheme is considerably more robust, will provide a larger side-mode suppression ratio, and will not require that the $\Gamma g_{th}\alpha$ product be very small. This is due to novel features of the PCDBR design including the tilt of the section interfaces with respect to the facets, the oblique-lattice superposition of gratings (166 and 168) in the tuning section (156), and the prospects for etching away the active region in the tuning section (156) in order to take full advantage of the plasma index shift.

The mirror (146) beyond the second tuning section (left side of FIG. 8), which is preferably HR, can be defined by cleaving or etching (at the same or a different angle from the AR-coated mirror adjacent to the PCDBR mirror). It can be a coated or uncoated facet, or reflection may be provided by a DBR or PCDBR region. The active (150) and PCDBR (156) sections can be defined by a single epitaxial growth with post-growth processing such as etching, or alternatively by selective-area epitaxy or another regrowth strategy. Tuning sections (156 and 158) with a wide variety of energy gaps relative to the active region fall under the scope of the invention. The energy gap in the tuning section can be much larger than that in the active section, just slightly larger, or the same as in the active section (not preferred). The modal refractive index in the tuning sections (156 and 158) can be modulated by many possible mechanisms, including plasma shift and modulation of the interband, intervalence, intersubband, or free or bound exciton or impurity-level absorption. Absorption modulation could involve engineering of the conduction or valence band edge density of states, or absorption processes involving states far away from the band edges.

Figure 9:
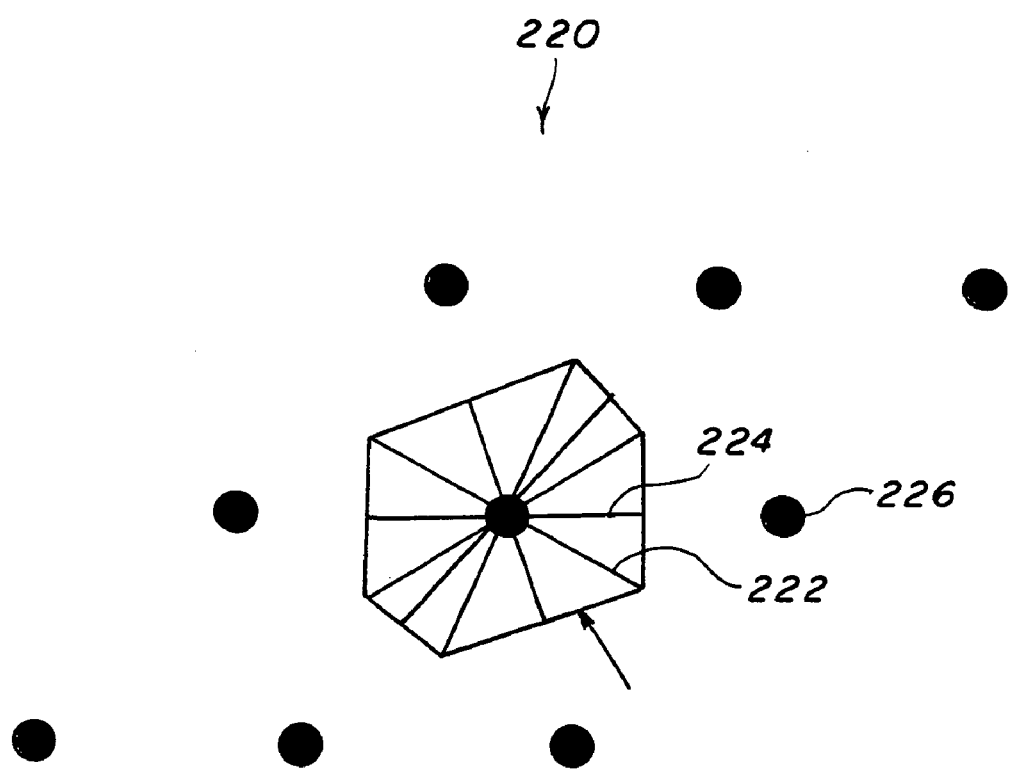
FIG. 9 shows a schematic representation of an oblique-lattice PCDFB structure according to the present invention.

The two-dimensional nature of the feedback in photonic-crystal lasers provides an additional inventive mechanism for varying the wavelength through angle tuning, which takes advantage of the fact that in a photonic crystal the resonance wavelength is not fixed by the period as in DFB and DBR lasers, but varies as a function of the propagation direction. For example, if the propagation direction is by some means aligned with the short period $\Lambda_2$ of the photonic crystal geometry considered in connection with FIG. 1, any variation of the propagation direction by some angle $\phi$ will also produce wavelength tuning by a factor of $1/\cos\phi$. A similar effect may be obtained in an oblique lattice as in FIG. 9 (220) defined by a 2D periodic array of features (226), in which there are no two degenerate axes (such as (222) and (224)), which leads to more choices of possible orientation of the propagation direction. Note that this configuration relies on a single propagation direction with a variable angle, rather than on the propagation along two coupled off-axis directions that occurs in wide-stripe PCDFB lasers.

Embodiments employing the angle tuning mechanism combine the 2D nature of the photonic crystal, a well-defined propagation direction that is not determined by the photonic crystal properties, single-mode operation, and a convenient means of switching between different angles (wavelengths). A well-defined propagation direction can be selected by using a ridge waveguide, which must be narrow enough (at most several tens of photonic crystal periods) to insure single-mode operation. In that case the periodic structure outside of the ridge will be interrupted, and only relatively coarse wavelength multiplexing can be realized.

Figure 10:
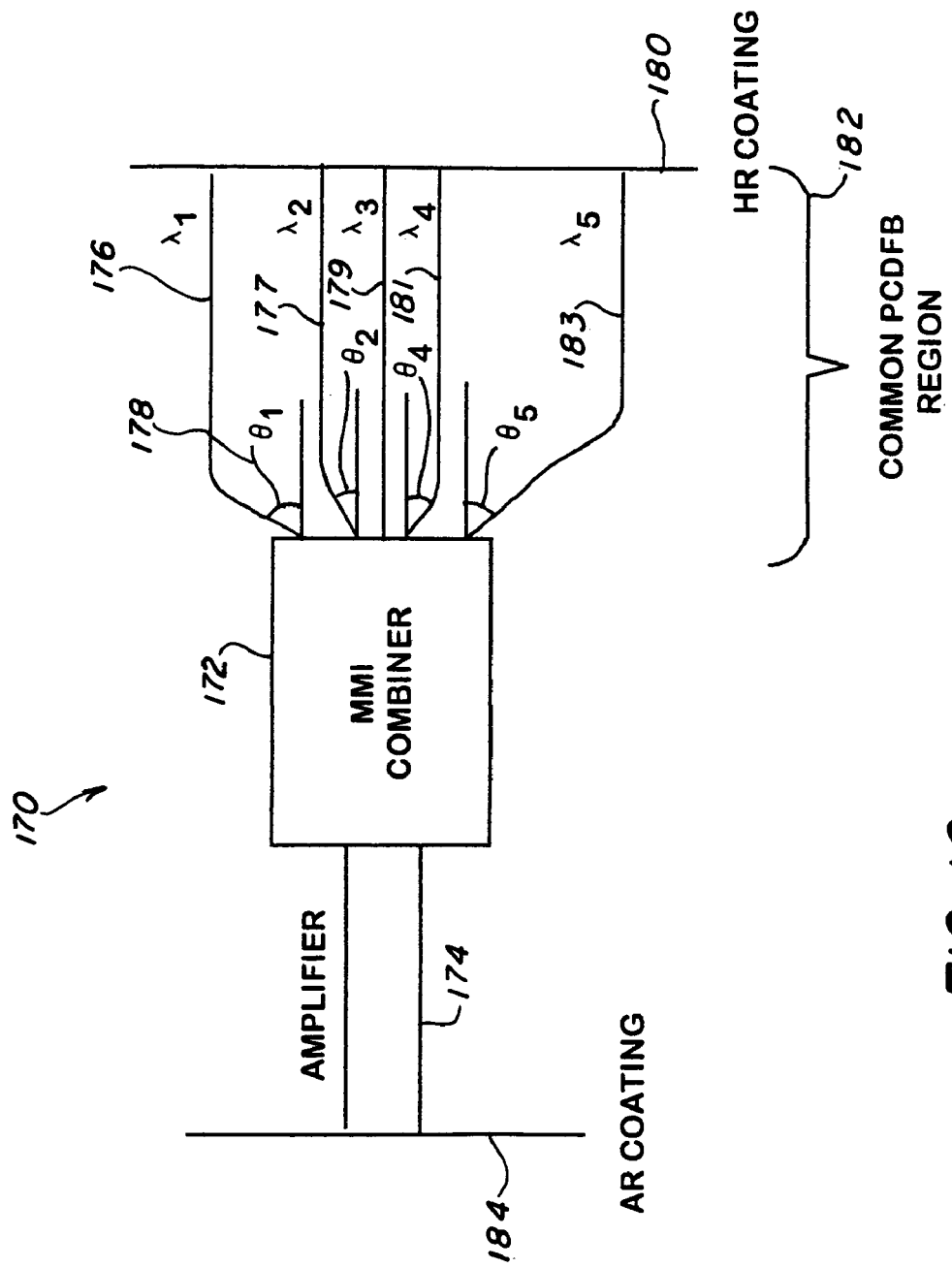
FIG. 10 shows a schematic representation of a multi-section wavelength-tunable PCDFB laser according to the present invention wherein each laser in the array employs the same photonic crystal feedback to produce multiple angles and emission wavelengths.

Nevertheless, spanning the wavelength range in relatively large increments using an array of waveguides oriented at different angles with respect to the common photonic crystal grating may be useful in some applications. For example, discrete wavelengths at $\delta\lambda$ intervals corresponding to roughly 1–2% of the central wavelength $\lambda_0$ will be attainable, so that a typical gain bandwidth $\Delta\lambda/\lambda$ of 10% would produce a total of 5–10 discrete wavelengths. A larger total number of wavelengths is attainable if the gain bandwidth can be broadened, artificially or otherwise. The definition of the facets is inessential in this configuration, insofar as feedback is provided in a distributed manner by the grating. It is estimated that the minimum increment in this arrangement will be on the order of one percent of the center wavelength, even in a structure with a small $\Gamma g_{th}\alpha$ product. The output of the discrete laser waveguides can be combined using a multimode interference (MMI) optical combiner. The waveguide sections next to the combiner may be gently curved in order to assure that the beam exiting the MMI combiner couples efficiently to an optical amplifier or another optical system. A schematic of a possible device configuration (170) employing the angle tuning mechanism is shown in FIG. 10, where only 5 waveguides (176, 177, 179, 181, and 183) are shown representing 5 wavelengths. The five wavelengths are located in a common PCDFB region (182) and are connected via an MMI combiner (172) to an amplifier (174). This arrangement is confined between a first facet (180) having an HR coating and a second facet having an AR coating (184). Either electrical or optical pumping may be employed to excite the individually contacted waveguides (176, 177, 179, 181, and 183), which may be turned on independently or in combination.

The extra step of defining individual ridge waveguides (176, 177, 179, 181, and 183) is not strictly necessary if optical pumping is employed. By tailoring the pump beam to vary the angle (178) it makes with the photonic-crystal structure of the sample, gain-guided devices with pump-angle-based wavelength tuning may be realized. The advantage of this configuration is a reduced complexity of the fabrication process.

The mechanism of wavelength tuning by changing the propagation direction (propagation angle) in a photonic crystal has the advantage of a straightforward selection of different wavelengths from photonic crystal devices monolithically fabricated on a single wafer. To accomplish a similar wavelength multiplexing with conventional DFB lasers, the grating pitch in each device must be carefully adjusted in each wavelength selection. The fabrication procedure for a gain-guided angle-tunable photonic crystal laser is particularly straightforward, since no ridges need to be defined.

Figure 11:
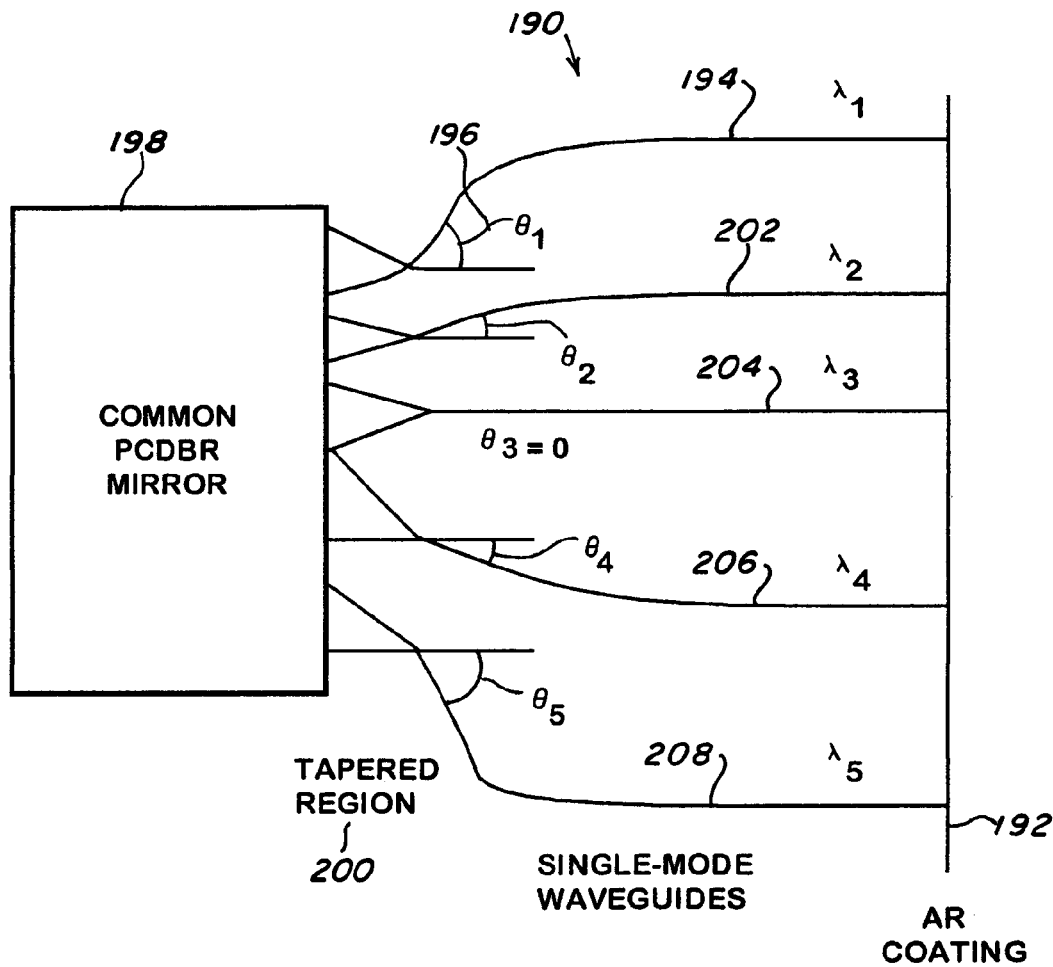
FIG. 11 shows a schematic representation of a multi-section wavelength-tunable PCDFB laser according to the present invention wherein each laser in the array employs the same PCDBR feedback to produce multiple angles and emission wavelengths.

A third approach to wavelength tuning by angle variation based on the PCDBR configuration (190) is shown schematically in FIG. 11. A well-defined propagation direction at some angle (196) with respect to a normal to a facet (192) is selected via an array of single-mode ridge waveguides (194, 202, 204, 206, and 208) in the otherwise-unpatterned section of the sample. The optical output is taken out of one end of the single-mode waveguides (194, 202, 204, 206, and 208) and is terminated by an AR-coated facet (192). The waveguides (194, 202, 204, 206, and 208) can be curved near the facet (192) in order to obtain output beams that are nearly normal to the facet, which also removes the limit on maximum internal angle that can be coupled out of the device. At the other end, the waveguides are slowly broadened in a tapered section (200), which is gradual enough to preserve their single-mode nature. The tapered ends are fed into a common broad-area PCDBR mirror (198). The PCDBR mirror (198) provides feedback at a wavelength that varies with the direction of propagation (depending on which individual waveguide is excited). The tapering in this case is required to take full advantage of the 2D nature of the photonic crystal in the PCDBR mirror.

When rectangular photonic crystals effectively consist of the superposition of two distinct gratings, a vanishing value of the DFB-like reflection coefficient $\kappa_1'$ is produced (whereas the other two coupling coefficients can retain large values corresponding to Bragg reflections from each of the gratings). Since the gratings are separable, they do not necessarily need to co-exist in the same layer. In fact, the physical nature of the two gratings can be quite different as long as the net index modulation is adjusted to be comparable, and the resulting-coupling coefficients are in a favorable range. The inventive method uses separable gain-coupled gratings based on patterning with an optical pump.

In one embodiment, an optical pump may be used to pattern the photonic crystal even in two dimensions, e.g., by employing a 2D microlens array or 2D optical interference. If carrier diffusion is neglected, then the injected carrier density will replicate the pattern of the pump beam. Modulation of the carrier density will affect both the refractive index and the optical gain, although gain coupling is expected to dominate. However, the $\Lambda_2$ period of an optimized first-order PCDFB structure is less than a micron even at mid-IR wavelengths, whereas typical diffusion lengths in mid-IR antimonide laser materials tend to be close to a micron at cryogenic temperatures and decrease to a few tenths of a micron at room temperature. Therefore, it is unlikely that a full optically generated 2D PCDFB pattern can survive unless higher-order mid-IR or long-wavelength IR lasers are operated at elevated temperatures.

Figure 12:
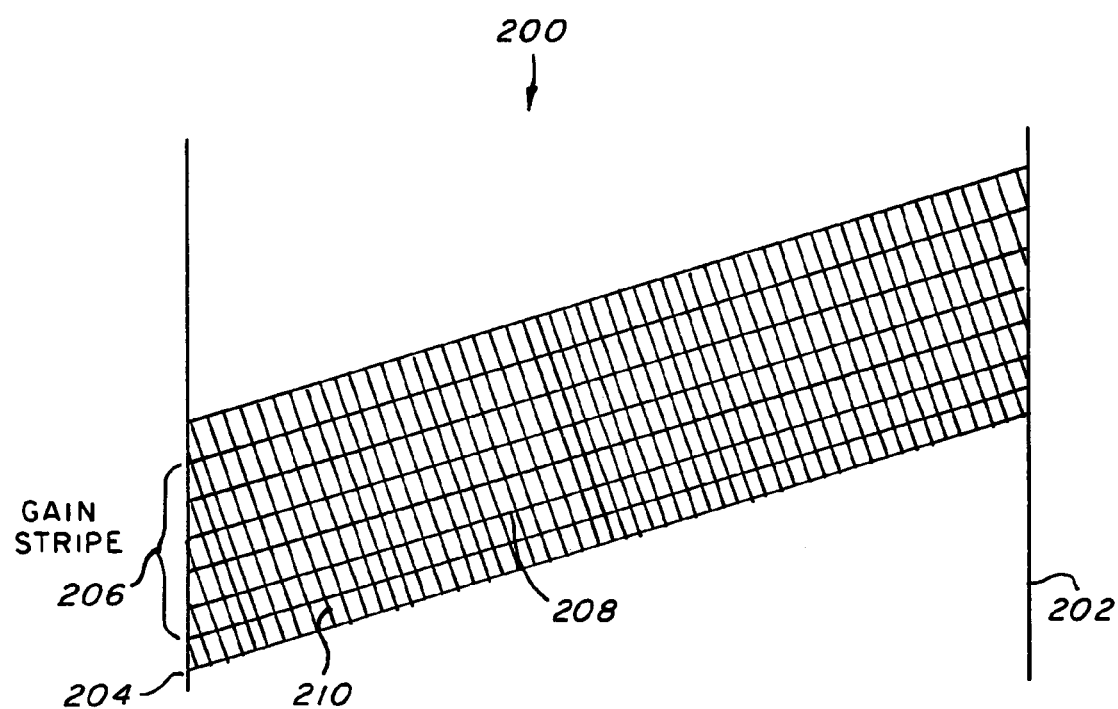
FIG. 12 shows a schematic representation of a tunable 2D grating consisting of two superimposed line gratings, one of which is etched and the other defined by a modulated optical pump beam.

This carrier-diffusion limitation can be effectively circumvented in another embodiment (200) shown in FIG. 12 by physically defining one of the gratings (210) by etching, while creating the other grating (208) by spatially modulating the pump beam in the perpendicular dimension. The etched grating (210) can operate either by index coupling or gain coupling. Since an optically defined first-order grating (208) designed for mid-IR wavelengths will have a period of several microns, it is likely to survive even in the presence of appreciable carrier diffusion at low temperatures. The concept can be extended to the near-IR spectral region by employing higher-order optically defined gratings. In order to obtain a 1D grating from a uniform pump beam, a number of optical systems can be utilized. One of these includes positioning a 0/−1 phase mask (a configuration known to those skilled in the art) close to the sample surface, creating an interference pattern with a period of a few microns at the sample surface. Optical interference between the two halves of a split pump beam to form a transient grating may also be employed. The concept can further be extended to electrically pumped systems, in which a grating can be created along or both axes by the selective epitaxial deposition of a p-n junction between the contacts and the active region.

When a patterned optical pumping beam is used to induce one of the gratings (208), the lasing wavelength can be tuned by changing the period of that grating. This can be accomplished by tilting the 0/−1 phase mask with respect to the sample surface, varying the optical path length between the phase mask and the sample surface, varying the incidence angle for the transient grating, etc. It should be noted that the wavelength modulation induced by the spatially-modulated optical pumping will be accompanied by beam steering, corresponding to an internal angle varying as the inverse tangent of the ratio between the two periods.

One advantage of the photonic-crystal scheme with one etched and one optically induced grating is that there is no need to transfer a 2D pattern to the sample. The grating definition could be equivalent to the procedures commonly employed in conventional 1D DFB lasers, such as holographic patterning or optical lithography. The operating wavelength is continuously tunable by varying the period of the optical grating.

Figure 13:
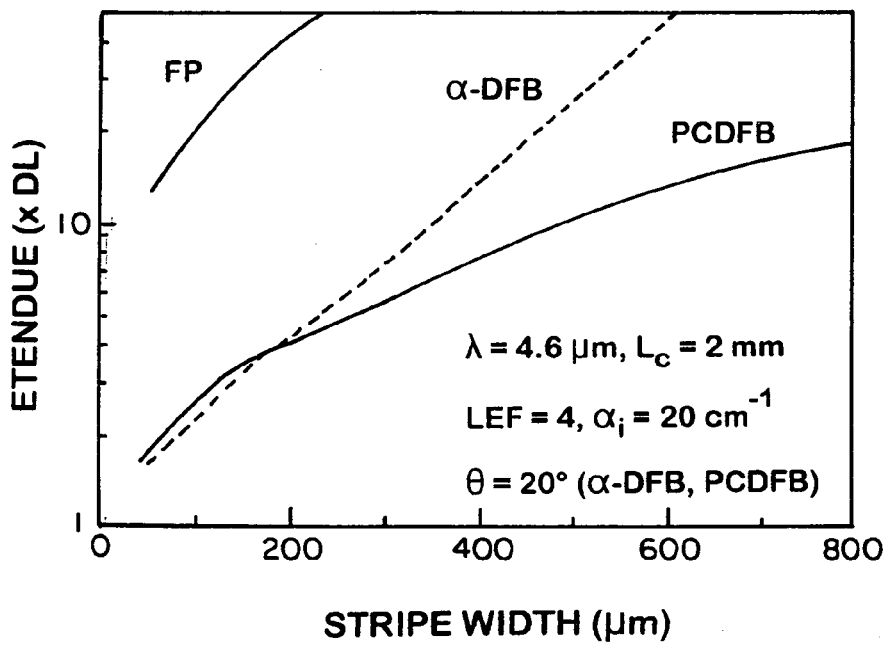
FIG. 13 shows a plot of the etendue (in units of the diffraction limit) as a function of stripe width for Fabry-Perot (FP), $\alpha$-DFB, and PCDFB lasers pumped by a top-hat profile at 14 times threshold. For all three lasers the wavelength is 4.6 $\mu$m, the cavity length is 2 mm, and the internal loss is 20 cm$^{-1}$. For the ($\alpha$-DFB and PCDFB lasers, $\theta=20°$ and $\kappa_2=200$ cm$^{-1}$, while and $\kappa_1=\kappa_3=0$ for the $\alpha$-DFB laser and $\kappa_1=\kappa_3=10$ cm$^{-1}$ for the PCDFB laser.

The inventive laser design provides diffraction in three different directions, including DFB-like reflection, that are inherent to the PCDFB laser operation. The results for the beam quality of the emitted light are defined in terms of the etendue. Etendue is the product of the standard deviations of the near-field pattern and the far-field pattern, the former measuring the spatial extent of the emitted beam at the facet and the latter quantifying the angular divergence of the diffracted beam away from the facet. It is well known in the art that the minimum etendue for a Gaussian beam, referred to as the diffraction limit, is proportional to the operating wavelength. FIG. 13 illustrates the results from the inventive calculation for the etendue as a function of stripe width for the case of LEF=4, a 2-mm-long cavity, and pumping by a top-hat profile at 14 times threshold (I=14$I_{th}$). Etendues are shown for the cases of Fabry-Perot (FP), α-DFB, and rectangular-lattice PCDFB lasers. The coupling coefficient for the α-DFB laser is 200 cm$^{-1}$, and the coupling coefficients for the PCDFB device are $\kappa_1'$=$\kappa_3'$=10 cm$^{-1}$ and $\kappa_2'$=200 cm$^{-1}$, with θ=20°. Whereas the FP laser has quite poor beam quality for all of the considered stripe widths (≧50 μm), both the α-DFB and PCDFB outputs are near-diffraction-limited for widths narrower than ≈100 μm. As the pump stripe is broadened, however, the etendue for the PCDFB laser increases much more slowly, remaining below 10 times the diffraction limit (DL) for stripes as wide as 500 μm. This result demonstrates the considerable advantages of the inventive PCDFB with the optimized parameter space outlined above as compared to the prior state of the art (FP and α-DFB).

Figure 14:
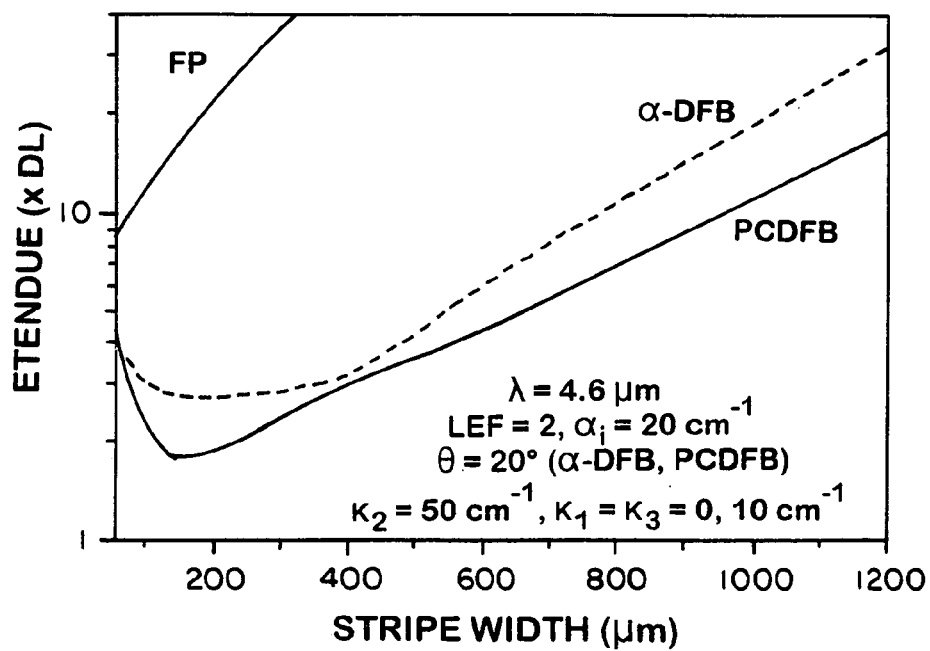
FIG. 14 shows a plot of the etendue (in units of the diffraction limit) as a function of stripe width for Fabry-Perot (FP), $\alpha$-DFB, and PCDFB lasers with the same properties as those of FIG. 11 except that LEF=2 and $\kappa_2=50$ cm$^{-1}$ for the $\alpha$-DFB and PCDFB lasers.

FIG. 14 shows calculated etendues for FP, α-DFB, and rectangular-lattice PCDFB lasers identical to those in FIG. 13, except that LEF=2. The PCDFB performs better than the α-DFB over the whole range of stripe widths, and both significantly outperform the FP laser. The slight increase in the etendue at narrow stripe widths is due to the smaller $\kappa_2'$=50 cm$^{-1}$ employed in order to assure the best performance at wider stripe widths. The range of parameters illustrated in FIG. 14 should be most advantageous for some classes of quantum-well lasers such as near-IR unstrained devices, telecommunications lasers, and good-quality mid-IR "W" lasers. We note that while in the case of telecommunications lasers either a smaller internal loss or a smaller LEF (e.g., by p-type modulation doping) can in principle be obtained, in practice it has remained challenging to demonstrate a small $\Gamma g_{th}\alpha$ product.

Figure 15:
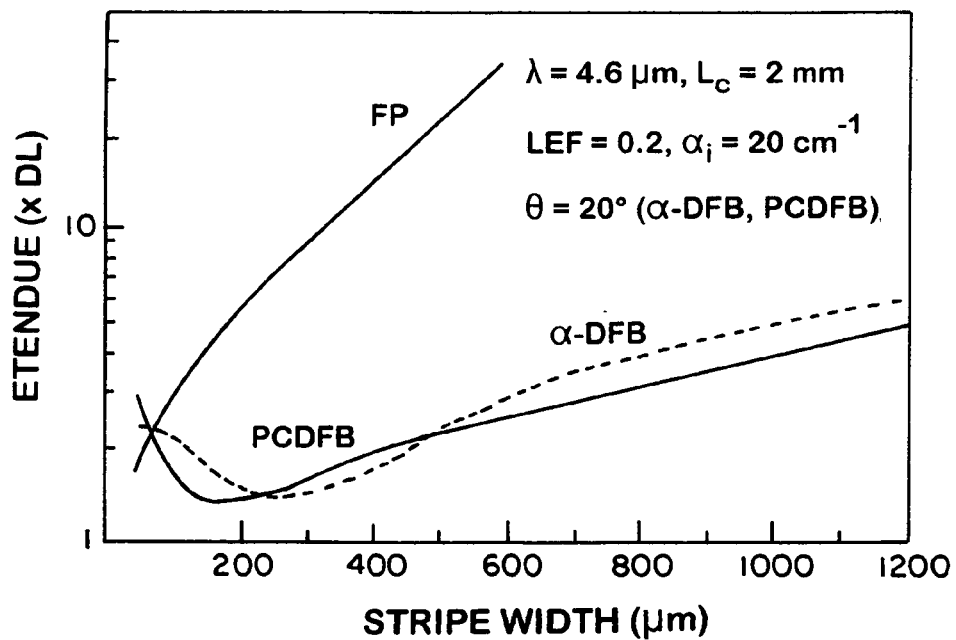
FIG. 15 shows a plot of the etendue (in units of the diffraction limit) as a function of stripe width for Fabry-Perot (FP), $\alpha$-DFB, and PCDFB lasers with the same properties as those of FIG. 11 except that LEF=0.2 and $\kappa_2=50$ cm$^{-1}$ for the $\alpha$-DFB and PCDFB lasers.

FIG. 15 shows the etendues for FP, α-DFB, and rectangular-lattice PCDFB lasers with LEF=0.2, the value estimated for a typical QCL emitting at λ=4.6 μm. The non-zero value of the LEF arises from a combination of the conduction-band nonparabolicity and the plasma contribution to the refractive index. The latter becomes more pronounced at longer wavelengths, whereas the former is rarely expected to exceed approximately 0.1 for the InGaAs/AlInAs and GaAs/AlGaAs material systems currently used to fabricate QCLs. The results in FIG. 15 may also be applicable to high-quality interband near-IR lasers in which the internal loss is no more than 5 cm$^{-1}$, whereas the LEF can be on the order of or less than 1, and to quantum-dot lasers, for which very low LEF values (0.1–0.5) have been measured. Although the beam quality provided by the α-DFB in FIG. 13 is also good, the PCDFB laser yields nearly diffraction-limited output (with a slight deviation of the etendue due to the slightly non-Gaussian near field) for stripes as wide as 1.5 mm. The robustness of the single-mode spectral purity of the rectangular-lattice PCDFB is superior to that of the α-DFB, and also expect further improvements at the widest stripewidths when a hexagonal-lattice PCDFB is employed. The FP structure once again shows much poorer beam quality.

Figure 16:
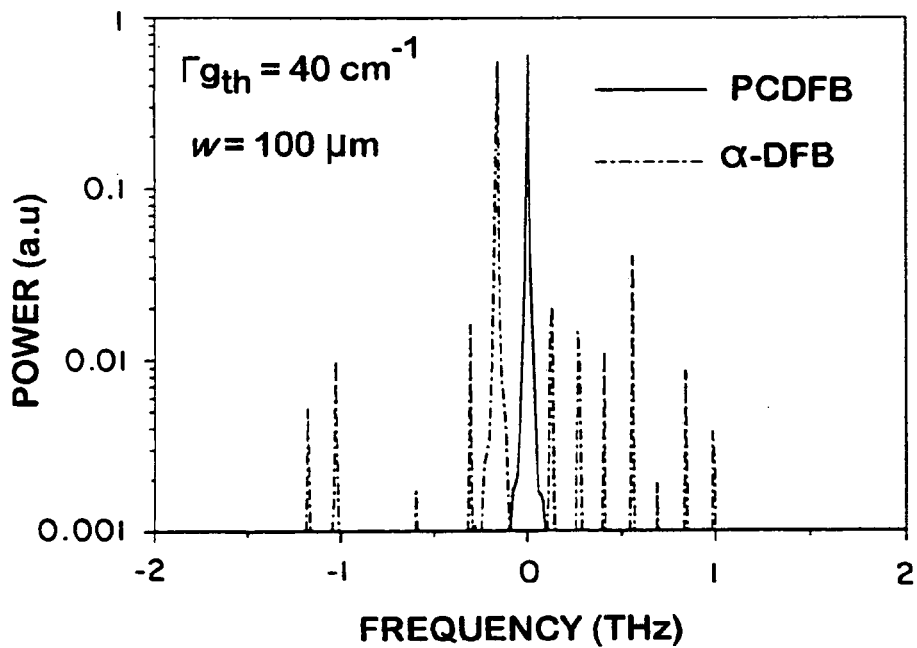
FIG. 16 shows a plot of the emission spectrum of the PCDFB (solid curve) laser and the $\alpha$-DFB (dashed line) laser, with a stripe width of 100 $\mu$m, a $\Gamma g_{th}\alpha$ product of 40 $\mu$m, and an emission wavelength of $\lambda=4.6$ $\mu$m.

The PCDFB approach of the present invention also provides a substantial extension of the conditions under which single-mode operation can be sustained in the presence of LEF-driven index fluctuations. This is shown in FIG. 16 which illustrates emission spectra for 100-μm-wide PCDFB and α-DFB lasers with $\Gamma g_{th}\alpha$=40 cm$^{-1}$. Whereas the PCDFB device has a side-mode suppression ratio (SMSR) of >>30 dB, the α-DFB output is clearly multi-mode. FIG. 2 shows a contour plot, as a function of $\Gamma g_{th}\alpha$, of the stripe widths at which the PCDFB (light gray), α-DFB (gray) and conventional DFB (black) lasers operate in a single mode. In order to readily discriminate against noise without resorting to a very fine mesh and/or unreasonably long run time, a rather lax condition, SMSR≧20 dB, is used to define single-mode output. The PCDFB is seen to have a far more extensive single-mode region than either the α-DFB or DFB devices. This implies that PCDFB single-mode output powers may be up to an order of magnitude higher. When the LEF is very small, as often occurs in QCLs, QD lasers, and specially-optimized quantum-well lasers, it is advantageous to employ a hexagonal lattice. Whereas the maximum output powers for the rectangular-lattice PCDFB is only somewhat larger than for the α-DFB laser in that limit, the optimized hexagonal-lattice PCDFB lattice produces a single-mode output at stripe widths of up to approximately 1.5 mm, and yields single-mode powers that are higher than for the α-DFB by a factor of approximately 2.5.

Even in the cases of single-mode operation for both α-DFB and PCDFB lasers, the spectral purity in the PCDFB is much more robust owing to the near absence of side modes. The suppressed yet still-observable side modes in the α-DFB laser usually become much more pronounced under pulsed operating conditions (owing to transient heating effects, etc.). Therefore, whereas α-DFB lasers have proven to be relatively unattractive single-mode sources for applications requiring fast direct modulation, optimized electrically-pumped PCDFB devices will operate up to the maximum modulation frequencies characteristic of state-of-the-art conventional DFB devices, i.e., in the GHz range. The maximum modulation frequencies of optically-pumped PCDFB lasers are substantially higher, up to 100 GHz, owing to the elimination of parasitic RC time constants. Of course, in the latter case the pump laser light must be modulated at the same frequency. Finally, the results presented in FIGS. 2 and 13–16 are attainable only in the optimized PCDFB configuration of the present invention with emission normal to the facet. Designs that do not employ parameters in the range specified in this invention may yield performance that is no better or even worse than that of α-DFB devices.

The PCDFB and PCDBR concepts disclosed here are broadly applicable to virtually any in-plane semiconductor laser emitting at any wavelength from the ultraviolet to the terahertz range in any material system or polarization of light.

PCDFB and PCDBR lasers can be pumped either electrically or optically, they can employ index-coupled, gain-coupled, or complex-coupled gratings, and they may have coated or uncoated facets defined by cleaving, etching or other technologies known to those skilled in the art. The gratings may incorporate one-dimensional or two-dimensional λ/4 phase shifts in order to improve the stability and reproducibility of the single-mode operation at the grating resonance. The gain stripes may be tapered in order to increase the single-mode power levels, using methods analogous to flared lasers and amplifiers known to those skilled in the art. The gratings in the PCDFB lasers can be chirped (linearly or quadratically) in order to suppress spatial-hole burning near the center of the laser waveguide at high output powers. For rectangular-lattice PCDFB lasers, one or the other period can be chirped independently, or both periods can be chirped simultaneously. The chirped PCDFB lasers may reach higher single-mode output powers, by analogy with chirped conventional DFB lasers.

In addition to rectangular photonic crystal lattices, the invention includes PCDFB lasers having a wide range of values of the $\Gamma g_{th} \alpha$ product. Hexagonal photonic crystal lattices may be used for wide-stripe PCDFB lasers with small $\Gamma g_{th} \alpha$ and other photonic crystal symmetries will display similar advantages. Slight misalignments from a true rectangular lattice or true hexagonal lattice are typically not detrimental to the laser performance.

While square, rectangular, or circular grating features (24 or 42) are often preferred under certain conditions as discussed, in general the PCDFB or PCDBR laser operation is not very sensitive to the exact shape of the grating features (24 or 42) as long as they produce coupling coefficients in the optimal ranges. In some designs it is not even required that the grating features (24 or 42) be totally distinct. For example, in designs where the optimal spacing between grating features (24 or 42) is very small along one axis, a corrugated line may have similar properties to a series of nearly-touching squares, rectangles, or circles, as long as the coupling coefficients are made to fall in the optimal ranges.

Combinations of the single-grating and PCDBR regions other than those of the preferred embodiment can also be used to tune the high-power single-mode output. The main criterion in such designs is the selection of a single wavelength using the PCDBR mirror and the use of the single-grating section to maintain spatial coherence in the emitting section. PCDBR mirrors with lattice symmetries other than oblique can also be used in those configurations.

The invention has been described in what is considered to be the most practical and preferred embodiments. It is to be recognized, however, that obvious modifications to these embodiments may occur to those skilled in this art. Accordingly the scope of the invention is to be discerned from reference to the appended claims.

What is claimed is:

1. A photonic-crystal distributed-feedback laser with an output power, a beam quality, a wavelength spectrum, and a product of a modal loss and a linewidth enhancement factor, comprising:
    a laser cavity with a waveguide structure that has a cavity length $L_c$ and is bounded by two mirrors;
    an active region for producing optical gain upon receiving optical pumping or an input voltage;
    at least one layer including a periodic two-dimensional grating with modulation of a modal refractive index, said grating being defined on a rectangular lattice with a first period along a first axis of said grating and a second period along a second perpendicular axis of said grating;
    said grating produces three diffraction processes having coupling coefficients $\kappa_1'$, $\kappa_2'$, $\kappa_3'$;
    a lateral gain area contained within a second area patterned with said grating that has substantially a shape of a gain stripe with a width W, with said gain stripe tilted at a first tilt angle relative to the two mirrors; and
    wherein said rectangular lattice of said grating is tilted at a second tilt angle substantially the same as the first tilt angle with respect to said gain stripe and the ratio of said first and second grating periods is equal to the tangent of said first tilt angle, with said first tilt angle being between about 16° and about 23°.

2. A photonic-crystal distributed-feedback laser as in claim 1, with said cavity length at least 1.5 mm.

3. A photonic-crystal distributed-feedback laser as in claim 2, wherein said product of the modal loss and linewidth enhancement factor is no larger than about 40 cm$^{-1}$.

4. A photonic-crystal distributed-feedback laser as in claim 3, wherein said stripe width W is between about 350 μm and about 450 μm and wherein said output power into a single spectral mode is optimized by requiring said coupling coefficients, said cavity length $L_c$, and said stripe width to substantially satisfy the relations: $|\kappa_3'| \approx |\kappa_1'|$; 2 cm$^{-1} \leq |\kappa_1'| \leq 10$ cm$^{-1}$; $0.5 \leq |\kappa_1'|L_c \leq 1.5$; 30 cm$^{-1} \leq |\kappa_2'| \leq 60$ cm$^{-1}$; and $1.3 \leq |\kappa_2'|W \leq 2.1$.

5. A photonic-crystal distributed-feedback laser as in claim 3, wherein said output power and said beam quality are both optimized by requiring said coupling coefficients, said cavity length $L_c$, and said stripe width W to substantially satisfy the relations: $|\kappa_3'| \approx |\kappa_1'|$; 2 cm$^{-1} \leq |\kappa_1'| \leq 10$ cm$^{-1}$; $0.5 \leq |\kappa_1'|L_c \leq 1.5$; and $0.5 \leq |\kappa_2'|W > 1.5$.

6. A photonic-crystal distributed-feedback laser as in claim 2, wherein said product of the modal loss and linewidth enhancement factor is between about 40 cm$^{-1}$ and about 100 cm$^{-1}$.

7. A photonic-crystal distributed-feedback laser as in claim 6, wherein said stripe width W is between about 150 μm and about 350 μm and wherein said output power into a single spectral mode is optimized by requiring said coupling coefficients, said cavity length $L_c$, and said stripe width to substantially satisfy the relations: $|\kappa_3'| \approx |\kappa_1'|$; 4 cm$^{-1} \leq |\kappa_1'| \leq 15$ cm$^{-1}$; $1.0 \leq |\kappa_1'|L_c \leq 2.0$; 60 cm$^{-1} \leq |\kappa_2'| \leq 150$ cm$^{-1}$; and $1.5 \leq |\kappa_2'|W \leq 2.5$.

8. A photonic-crystal distributed-feedback laser as in claim 6, wherein said output power and said beam quality are both optimized by requiring said coupling coefficients, said cavity length $L_c$, and said stripe width W to substantially satisfy the relations: $|\kappa_3'| \approx |\kappa_1'|$; 4 cm$^{-1} \leq |\kappa_1'| \leq 10$ cm$^{-1}$; $1 \leq |\kappa_1'|L_c \leq 1.5$; and $0.5 \leq |\kappa_2'|W \leq 1.5$.

9. A photonic-crystal distributed-feedback laser as in claim 2, wherein said product of modal loss and linewidth enhancement factor is larger than about 100 cm$^{-1}$.

10. A photonic-crystal distributed-feedback laser as in claim 9, wherein said stripe width W is no larger than about 150 μm and wherein said output power into a single spectral mode is optimized by requiring said coupling coefficients, said cavity length $L_c$, and said stripe width to substantially satisfy the relations: $|\kappa_3'|\approx|\kappa_1'|$; $8$ cm$^{-1}\leq|\kappa_1'|\leq 15$ cm$^{-1}$; $1.5\leq|\kappa_1'|L_c\leq 2.5$; $150$ cm$^{-1}\leq|\kappa_2'|\leq 250$ cm$^{-1}$; and $2.0\leq|\kappa_2'|W\leq 2.5$.

11. A photonic-crystal distributed-feedback laser as in claim 9, wherein said output power and said beam quality are both optimized by requiring said coupling coefficients, said cavity length $L_c$, and said stripe width W to substantially satisfy the relations: $|\kappa_3'|\approx|\kappa_1'|$; $1.5\leq|\kappa_1'|L_c\leq 2$; and $1.5\leq|\kappa_2'|W\leq 2.0$.

* * * * *